US 8,035,800 B2

(12) United States Patent
Nishii

(10) Patent No.: US 8,035,800 B2
(45) Date of Patent: Oct. 11, 2011

(54) EXPOSURE APPARATUS, MAINTENANCE METHOD, EXPOSURE METHOD, AND METHOD FOR PRODUCING DEVICE

(75) Inventor: Yasufumi Nishii, Kumagaya (JP)

(73) Assignee: Nikon Corporation, Tokyo (JP)

( * ) Notice: Subject to any disclaimer, the term of this patent is extended or adjusted under 35 U.S.C. 154(b) by 746 days.

(21) Appl. No.: 11/716,621

(22) Filed: Mar. 12, 2007

(65) Prior Publication Data

US 2008/0013064 A1    Jan. 17, 2008

Related U.S. Application Data

(60) Provisional application No. 60/785,982, filed on Mar. 27, 2006.

(30) Foreign Application Priority Data

Mar. 13, 2006    (JP) ................................. 2006-067476

(51) Int. Cl.
G03B 27/42    (2006.01)
G03B 27/52    (2006.01)

(52) U.S. Cl. .......................................... 355/53; 355/30

(58) Field of Classification Search .................... 355/30, 355/53, 67; 250/548
See application file for complete search history.

(56) References Cited

U.S. PATENT DOCUMENTS

| | | |
|---|---|---|
| 4,346,164 A | 8/1982 | Tabarelli et al. |
| 4,480,910 A | 11/1984 | Takanashi et al. |
| 5,610,683 A * | 3/1997 | Takahashi ..................... 355/53 |
| 5,715,039 A | 2/1998 | Fukuda et al. |
| 5,825,043 A | 10/1998 | Suwa |
| 5,969,441 A | 10/1999 | Loopstra et al. |
| 6,341,007 B1 | 1/2002 | Nishi et al. |
| 6,400,441 B1 | 6/2002 | Nishi et al. |
| 6,549,269 B1 | 4/2003 | Nishi et al. |
| 6,590,634 B1 | 7/2003 | Nishi et al. |
| 6,608,681 B2 | 8/2003 | Tanaka et al. |
| 6,611,316 B2 | 8/2003 | Sewell |
| 6,778,257 B2 | 8/2004 | Bleeker et al. |
| 6,897,963 B1 | 5/2005 | Taniguchi et al. |
| 6,952,253 B2 | 10/2005 | Lof et al. |
| 7,023,610 B2 | 4/2006 | Ohtsuki et al. |
| 7,075,616 B2 | 7/2006 | Derksen et al. |
| 7,522,259 B2 * | 4/2009 | Hazelton et al. ................ 355/30 |
| 7,804,576 B2 | 9/2010 | Fujiwara et al. |
| 2004/0165159 A1 | 8/2004 | Lof et al. |

(Continued)

FOREIGN PATENT DOCUMENTS

DE    221 563 A1    4/1985

(Continued)

OTHER PUBLICATIONS

U.S. Appl. No. 10/581,307, filed Sep. 29, 2006 in the name of Hiroyuki Nagasaka.

(Continued)

*Primary Examiner* — Hung Henry Nguyen
(74) *Attorney, Agent, or Firm* — Oliff & Berridge, PLC

(57) ABSTRACT

An exposure apparatus EX includes a liquid immersion system and an exchange system which performs exchange of the liquid immersion member. The exchange system has a holding device which holds the liquid immersion member detachably and a transport device. By using the exchange system, it is possible to suppress the lowering in the working rate due to the cleaning or exchange of the liquid immersion member.

39 Claims, 18 Drawing Sheets

U.S. PATENT DOCUMENTS

| | | |
|---|---|---|
| 2005/0248856 A1 | 11/2005 | Omura et al. |
| 2005/0274898 A1* | 12/2005 | Watanabe et al. ............. 250/372 |
| 2005/0280791 A1 | 12/2005 | Nagasaka et al. |
| 2006/0121364 A1 | 6/2006 | Omura |
| 2006/0231206 A1 | 10/2006 | Nagasaka et al. |
| 2006/0250593 A1 | 11/2006 | Nishii |
| 2007/0103661 A1 | 5/2007 | Nishii |
| 2007/0115450 A1 | 5/2007 | Nagasaka et al. |
| 2007/0285634 A1 | 12/2007 | Nagasaka et al. |
| 2007/0291239 A1 | 12/2007 | Shiraishi |

FOREIGN PATENT DOCUMENTS

| | | |
|---|---|---|
| DE | 224 448 A1 | 7/1985 |
| EP | 1 420 298 A2 | 5/2004 |
| EP | 1 699 072 A1 | 9/2006 |
| EP | 1 783 821 A1 | 5/2007 |
| EP | 1 814 146 A1 | 8/2007 |
| EP | 1 821 337 A1 | 8/2007 |
| JP | A 58-202448 | 11/1983 |
| JP | A 59-19912 | 2/1984 |
| JP | A 62-65326 | 3/1987 |
| JP | A 63-157419 | 6/1988 |
| JP | A 4-305915 | 10/1992 |
| JP | A 4-305917 | 10/1992 |
| JP | A 5-62877 | 3/1993 |
| JP | A 6-124873 | 5/1994 |
| JP | A 7-220990 | 8/1995 |
| JP | A 8-316125 | 11/1996 |
| JP | A 10-163099 | 6/1998 |
| JP | A 10-214783 | 8/1998 |
| JP | A 10-303114 | 11/1998 |
| JP | A 10-340846 | 12/1998 |
| JP | A 11-135400 | 5/1999 |
| JP | A 11-176727 | 7/1999 |
| JP | A 2000-58436 | 2/2000 |
| JP | A 2000-505958 | 5/2000 |
| JP | A 2000-164504 | 6/2000 |
| JP | A 2001-510577 | 7/2001 |
| JP | A 2004-519850 | 7/2004 |
| JP | A 2004-289126 | 10/2004 |
| JP | A-2005-191517 | 7/2005 |
| JP | A 2005-191557 | 7/2005 |
| JP | A 2005-268412 | 9/2005 |
| JP | A 2005-347617 | 12/2005 |
| JP | A 2005-353820 | 12/2005 |
| WO | WO 99/23692 A1 | 5/1999 |
| WO | WO 99/28790 | 6/1999 |
| WO | WO 99/46835 A1 | 9/1999 |
| WO | WO 99/49504 | 9/1999 |
| WO | WO 01/35168 A1 | 5/2001 |
| WO | WO 2004/019128 A2 | 3/2004 |
| WO | WO 2004/024517 A1 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/086468 A1 | 10/2004 |
| WO | WO 2004/107011 | 12/2004 |
| WO | WO 2005/024517 A2 | 3/2005 |
| WO | WO 2005/029559 A1 | 3/2005 |
| WO | WO 2005/055296 A1 | 6/2005 |
| WO | WO 2005/059617 A2 | 6/2005 |
| WO | WO 2005/059618 A2 | 6/2005 |
| WO | WO 2005/119742 A1 | 12/2005 |
| WO | WO 2005/122218 A1 | 12/2005 |
| WO | WO 2006/038952 A2 | 4/2006 |
| WO | WO 2006/054719 A1 | 5/2006 |
| WO | WO 2006/062065 A1 | 6/2006 |

OTHER PUBLICATIONS

U.S. Appl. No. 11/628,482, filed Dec. 1, 2006 in the name of Yasufumi Nishii, et al.

International Search Report issued in International Patent Application No. PCT/JP2007/054706; May 15, 2007.

* cited by examiner

EXPOSURE APPARATUS, MAINTENANCE METHOD, EXPOSURE METHOD, AND METHOD FOR PRODUCING DEVICE

CROSS REFERENCE TO RELATED APPLICATION

The present application claims the benefit of priority from Japanese Patent Application No. 2006-067476 filed on Mar. 13, 2006 and U.S. Provisional Patent Application No. 60/785,982 filed on Mar. 27, 2006, the entire disclosures of which are incorporated herein by reference.

BACKGROUND OF THE INVENTION

Field of the Invention

The present invention relates to an exposure apparatus which exposes a substrate, a maintenance method, an exposure method and a method for producing a device.

As an exposure apparatus used in the photolithography process, there is provided a liquid immersion exposure apparatus which forms a liquid immersion area with a liquid on a substrate and exposes the substrate through the liquid, as disclosed, for example, in International Publication No. 99/49504.

SUMMARY OF THE INVENTION

In the liquid immersion exposure apparatus, when there arises a problem or inconvenience such that a liquid immersion member, which makes contact with the liquid in the liquid immersion area, is polluted and/or the like, there is a possibility that the liquid immersion area cannot be formed in a desired state due to the problem, resulting in the degradation of the exposure accuracy and/or the measurement accuracy. To address this situation, it is conceivable to make the operator access the liquid immersion member in which the problem has occurred so that the operator performs maintenance operation and/or exchange operation. However, the operation rate of the exposure apparatus is lowered when the operation of the exposure apparatus is paused to perform the maintenance and/or exchange operation for the liquid immersion member.

An object of the present invention is to provide an exposure apparatus, a maintenance method, an exposure method and a device-producing method with which it is possible to suppress the lowering of the operation rate and/or to suppress the degradation of the exposure accuracy and the like due to the problem or failure in the liquid immersion member.

According to a first aspect of the present invention, there is provided an exposure apparatus which exposes a substrate by irradiating an exposure light onto the substrate through a liquid, comprising: a liquid immersion system which forms a liquid immersion area with the liquid on the substrate; and an exchange system which exchanges a liquid immersion member which constructs a part of the liquid immersion system and makes contact with the liquid forming the liquid immersion area.

According to the first aspect of the present invention, it is possible to suppress the lowering in operation rate caused by the exchange of the liquid immersion member or the like. In addition, upon exchanging the liquid immersion member in which a problem such as the pollution has occurred, it is possible to suppress the degradation of exposure accuracy and/or measurement accuracy.

According to a second aspect of the present invention, there is provided an exposure apparatus which exposes a substrate by irradiating an exposure light onto the substrate through a liquid, the exposure apparatus comprising: a liquid immersion system which forms a liquid immersion area with the liquid on the substrate; a liquid immersion member which makes contact with the liquid forming the liquid immersion area; and a holding device which detachably holds the liquid immersion member.

According to the second aspect of the present invention, by attaching and detaching the liquid immersion member by the holding device, it is possible to suppress the lowering of the operation rate of the exposure apparatus caused by, for example, cleaning (washing) or exchange of the liquid immersion member. In addition, upon cleaning or exchanging the liquid immersion member in which the problem such as the pollution occurs, it is possible to suppress the degradation of exposure accuracy and/or measurement accuracy.

According to a third aspect of the present invention, there is provided an exposure apparatus which exposes a substrate with an exposure light through a liquid, the exposure apparatus comprising: a liquid immersion member which surrounds a space between the substrate and an optical member via which the exposure light exits, and in which at least a part of a liquid immersion area of the liquid is formed; a frame member on which the liquid immersion member is provided; and a supporting device in which delivery and receipt of the liquid immersion member is performed to and from the frame member.

The third aspect of the present invention makes the liquid immersion member to be easily detached and attached, thereby decreasing the time required for the detachment and attachment, which consequently suppresses the lowering of the operation rate of the exposure apparatus caused by the cleaning or exchange of the liquid immersion member.

According to a fourth aspect of the present invention, there is provided a method for producing a device, comprising using the exposure apparatus according to any one of the first to third aspects. According to the device-producing method of the present invention, it is possible to suppress the lowering of the operation rate of the exposure apparatus and to thereby produce the device with enhanced productivity. In addition, upon performing the cleaning or exchange of the liquid immersion member in which the problem such as the pollution occurs, it is possible to suppress the degradation of exposure accuracy and/or measurement accuracy, thereby realizing the production of the device with enhanced precision.

According to a fifth aspect of the present invention, there is provided a maintenance method for an exposure apparatus having a liquid immersion member to which a substrate is arranged opposite and exposing the substrate through a liquid retained by the liquid immersion member, the method comprising: detaching the liquid immersion member from the exposure apparatus; and cleaning the detached liquid immersion member or exchanging the detached liquid immersion member with another liquid immersion member. According to the fifth aspect of the present invention, it is possible to suppress the degradation of the exposure accuracy and/or the measurement accuracy by cleaning or exchanging the liquid immersion member.

According to a sixth aspect of the present invention, there is provided a maintenance method for an exposure apparatus having a liquid immersion member which retains a liquid between an optical element and a substrate and exposing the substrate with an exposure light via the optical element and the liquid, the method comprising loading and unloading the liquid immersion member to exchange or clean the liquid immersion member. According to the sixth aspect of the present invention, the maintenance is easily performed by loading and unloading the liquid immersion member.

According to a seventh aspect of the present invention, there is provided an exposure method comprising: performing maintenance of an exposure apparatus having a liquid immersion member with the maintenance method of the present invention; and exposing a substrate through a liquid. According to the seventh aspect of the present invention, it is possible to perform the liquid immersion exposure highly precisely.

According to an eighth aspect of the present invention, there is provided an exposure method for exposing a substrate with an exposure light through a liquid, the method comprising: exposing the substrate with the exposure light while retaining the liquid in a space between the substrate and an optical member, via which the exposure light exits, by a liquid immersion member surrounding the space between the substrate and the optical element; and loading and unloading the liquid immersion member to exchange or clean the liquid immersion member. According to the eighth aspect of the present invention, the exchange or cleaning of the liquid immersion member can be performed easily.

According to a ninth aspect of the present invention, there is provided a method for producing a device, comprising: exposing a substrate by the exposure method according to the seventh or eighth aspect of the present invention; developing the exposed substrate; and processing the developed substrate. According to the device-producing method of the present invention, it is possible to produce a device with high accuracy and high reliability at a high throughput.

DESCRIPTION OF THE PREFERRED EMBODIMENTS

Embodiments of the present invention will be explained below with reference to the drawings. However, the present invention is not limited to the embodiments. It should be noted that in the following explanation, an XYZ orthogonal coordinate system is defined, and positional relationships among respective elements will be explained with reference to the XYX orthogonal coordinate system. In this XYZ orthogonal coordinate system, an X-axis direction is a predetermined direction in a horizontal plane; a Y-axis direction is a direction orthogonal to the X-axis direction in the horizontal plane; a Z-axis direction is a direction orthogonal both to the X-axis and Y-axis directions (namely, vertical direction); and directions of rotation about (inclination with respect to) the X-axis, Y-axis, Z-axis directions are defined as θY, θX and θZ directions respectively.

First Embodiment

Figure 1:
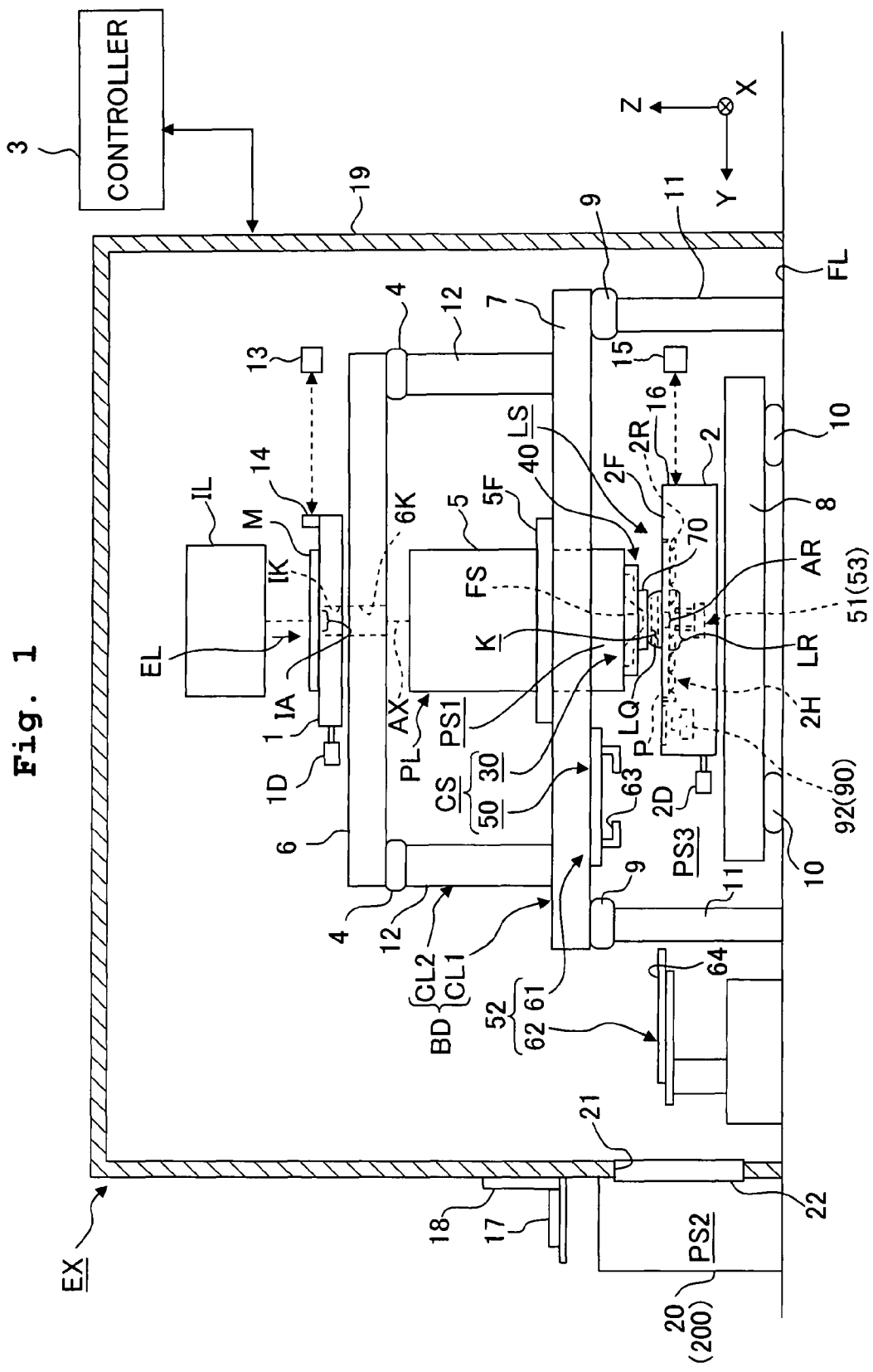
FIG. 1 shows a schematic arrangement view illustrating an exposure apparatus according to a first embodiment.

An explanation will be given about the first embodiment. FIG. 1 is a schematic arrangement view of an exposure apparatus EX according to the first embodiment. Referring to FIG. 1, the exposure apparatus EX includes a mask stage 1 which is movable while holding a mask M thereto; a substrate stage 2 which is movable while holding a substrate P thereto; an illumination optical system IL which illuminates, with an exposure light EL, a pattern of the mask M; a projection optical system PL which projects, onto the substrate P, an image of the pattern of the mask M illuminated with the exposure light EL; and a controller 3 which controls the entire operation of the exposure apparatus EX. Further, the exposure apparatus EX includes an input device 17 which is connected to the controller 3 and via which an operation signal can be inputted to the exposure apparatus EX; and an output device 18 which is connected to the controller 3 and which is capable of outputting an operation state of the exposure apparatus EX. The display device 17 includes at least one of a keyboard, a mouse, a touch panel and the like. The output device 18 includes at least one of a display device such as a flat panel display, a light-emitting device emitting a light, a sound-generating device which generates a sound (including alarm) and the like.

The term "substrate" referred to herein includes, for example, a substrate obtained by coating a photosensitive material (photoresist) on a base material formed of, for example, a semiconductor wafer such as silicon wafer, and also includes a substrate having a variety of kinds of films such as a protective film (top coat film) and/or the like in addition to the photosensitive film. The term "mask" includes a reticle having a device pattern which is formed thereon and which is to be subjected to reduction projection onto the substrate, exemplified by a reticle in which a predetermined pattern is formed on a transparent member such as a glass plate by using a light-shielding film made of chrome or the like. Such a light-transmissive type mask is not limited to a binary mask on which a pattern is formed with a light-shielding film and may include, for example, a phase shift mask such as a half-tone type mask or a mask of spatial frequency modulation type. In the embodiment, although a transmissive type mask is used as the mask, a reflective-type mask may also be used as the mask.

The exposure apparatus EX of this embodiment is a liquid immersion exposure apparatus to which the liquid immersion method is applied in order that the exposure wavelength is substantially shortened to improve the resolution and that the depth of focus is substantially widened. The exposure apparatus EX is provided with a liquid immersion system LS which forms a liquid immersion area LR of a liquid LQ on the substrate P so as to fill, with the liquid LQ, an optical path space K which includes an optical path for the exposure light EL and which is on a side of an image plane (light-exit side) of the projection optical system PL. The operation of the liquid immersion system LS is controlled by the controller 3. The liquid immersion system LS includes a liquid immersion member 70 which is arranged in the vicinity of the optical path space K and which has supply ports 71 capable of supplying the liquid LQ and a recovery port 72 capable of recovering the liquid LQ. The liquid immersion system LS uses the liquid immersion member 70 to form the liquid immersion area LR on the substrate P so as to fill, with the liquid LQ, the optical path space K which includes the optical path for the exposure light EL and which is between a final optical element (last optical element) FS closest to the image plane of the projection optical system PL among a plurality of optical elements of the projection optical system PL and a surface of the substrate P disposed on a substrate stage 2 arranged on the side of the image plane of the projection optical system PL. In the embodiment, water (pure or purified water) is used as the liquid LQ.

The exposure apparatus EX forms the liquid immersion area LR by using the liquid immersion system LS at least during a period of time in which an image of the pattern of the mask M is being projected onto the substrate P. The exposure apparatus EX irradiates the exposure light EL which has passed through the mask M onto the substrate P held on the substrate stage 2, via the projection optical system PL and the liquid LQ filled in the optical path space K, so as to project the image of the pattern of the mask M onto the substrate P, thereby exposing the substrate P. Further, the exposure apparatus EX of the embodiment adopts the local liquid immersion system in which the liquid LQ, filled in the optical path space K, including the optical path space for the exposure light EL between the final optical element FS and the substrate P, forms the liquid immersion area LR of the liquid LQ locally at a partial area on the substrate P, the partial area including a projection area AR of the projection optical system PL and the liquid immersion area LR being greater than the projection area AR and smaller than the substrate P.

In the embodiment, although the explanation will be given about a case in which the liquid immersion area LR is formed mainly on the substrate P, the liquid immersion area LR can also be formed on a partial area of an object, such as a partial area of the substrate stage 2, which is arranged at a position opposite to or facing the final optical element FS on the side of the image plane of the projection optical system PL. Further, during performing the exposure for a shot area, of the substrate P, located in the vicinity of the outer circumference of the substrate P, a part of the liquid immersion area LR is formed on the substrate P and the remaining part of the liquid immersion area LR is formed on the substrate stage 2.

Further, as will be described in detail later on, the exposure apparatus EX includes an exchange system CS which exchanges the liquid immersion member 70. The exchange system CS is provided with a holding device 30 which detachably holds the liquid immersion member 70 at a position in the vicinity of the optical path space K, and a transport device 50 which transports the liquid immersion member 70. The transport device 50 is capable of transporting the liquid immersion member 70 between a first position PS1 and a second position PS2 different from the first position PS1. In the embodiment, the first and second positions PS1 and PS2 are set to be separate and away in the Y-axis direction.

The exposure apparatus EX further includes a chamber 19 which accommodates at least the projection optical system PL. In the embodiment, the chamber 19 accommodates at least the mask stage 1, the substrate stage 2, at least a part of the illumination system IL, the projection optical system PL, at least a part of the liquid immersion system LS, and at least a part of the exchange system CS. Further, the input device 17 and the output device 18 are arranged outside the chamber 19.

Furthermore, an accommodating station 20 capable of accommodating the liquid immersion member 70 is arranged outside the chamber 19. In the embodiment, the holding device 30 is arranged at the first position PS1, and the accommodating station 20 is arranged at the second position PS2. The transport device 50 is capable of transporting the liquid immersion member 70 between the holding device 30 and the accommodating station 20.

Moreover, the exposure apparatus EX of the embodiment is a scanning-type exposure apparatus (so-called scanning stepper) which projects an image of the pattern of the mask M on the substrate P while synchronously moving the mask M and the substrate P in predetermined scanning directions. In the embodiment, the scanning direction for the substrate P (synchronous moving direction) is the Y-axis direction, and the scanning direction (synchronous moving direction) for the mask M is also the Y-axis direction. The exposure apparatus EX moves a shot area of the substrate P in the Y-axis direction with respect to the projection area AR of the projection optical system PL while moving a pattern-formation area of the mask M in the Y-axis direction with respect to an illumination area IA of the illumination system IL, in synchronization with the movement of the substrate P in the Y-axis direction, and irradiating the exposure light EL onto the projection area AR via the projection optical system PL and the liquid LQ, thereby exposing the shot area on the substrate P with the image of the pattern formed in the projection area AR.

The exposure apparatus EX is provided with a body BD including a first column CL1 disposed, for example, on a floor surface (or a base plate) in a clean room and a second column CL2 arranged on the first column CL1. The first column CL1 includes a plurality of first support columns 11 and a barrel-surface plate 7 supported by the first support columns 11 via anti-vibration devices 9. The second column CL2 includes a plurality of second support columns 12 and a mask-stage surface plate 6 supported by the second support columns 12 via anti-vibration devices 4.

The illumination system IL irradiates a predetermined illumination area IA on the mask M with the exposure light EL having a uniform illuminance distribution. Lights usable as the exposure light EL irradiated from the illumination system IL include, for example, emission lines (g-ray, h-ray, i-ray) radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm), the $F_2$ laser beam (wavelength: 157 nm), and the like. In the embodiment, the ArF excimer laser beam is used. It should be noted that although the illumination system IL is entirely arranged inside the chamber 19, it is allowable that a part of the illumination system IL is arranged outside the chamber 19. For example, it is allowable that an ArF excimer laser device generating the ArF excimer laser beam as the exposure light EL is arranged below the floor of the clean room and that the exposure light EL is guided, by a light-transmitting optical system including a beam matching unit, to an illumination system at least a part of which is arranged in the chamber 19.

The mask stage 1 is movable at least in the X-axis, Y-axis and θZ directions on the mask-stage surface plate 6 while holding the mask M thereto by the drive of a mask-stage driving device 1D including an actuator such as a linear motor. The mask stage 1 is supported with respect to the upper surface (guide surface) of the mask-stage surface plate 6 in a non-contact manner with an air bearing (air pad). The mask stage 1 has a first aperture 1K formed therein to allow the exposure light EL pass therethrough during the exposure of the substrate P. The mask-stage surface plate 6 has a second aperture 6K formed therein to allow the exposure light EL pass therethrough. The exposure light EL, after being irradiated from the illumination system IL and illuminating the pattern-forming area of the mask M, passes through the first aperture 1K of the mask stage 1 and the second aperture 6K of the mask-stage surface plate 6, and then comes into the projection optical system PL.

Position information (including rotation information) of the mask stage 1 (and consequently of the mask M) is measured by a laser interferometer 13. The laser interferometer 13 measures the position information of the mask stage 1 by using a reflection surface 14 of a movement mirror provided on the mask stage 1 in a fixed manner (or by using a reflection surface formed on a side surface of the mask stage 1). The controller 3 drives the mask-stage driving device 1D, based on the measurement result by the laser interferometer 13 to control the position of the mask M held on the mask stage 1.

The projection optical system PL projects the image of the pattern of the mask M onto the substrate P at a predetermined projection magnification. The projection optical system PL has a plurality of optical elements which are held by a barrel 5. The barrel 5 has a flange 5F, and the projection optical system PL is supported to the barrel-surface plate 7 via the flange 5F. Further, an anti-vibration device may be arranged between the barrel-surface plate 7 and the barrel 5. The projection optical system PL in this embodiment is a reduction system having the projection magnification which is, for example, ¼, ⅕, ⅛ or the like.

The substrate stage 2 has a substrate holder 2H which holds the substrate P, and the substrate stage 2 is movable on the substrate-stage surface plate 8 in the directions of six degrees of freedom in the X-axis, Y-axis, Z-axis, θX, θY, and θZ directions with the substrate P held thereon by, for example, the driving of a substrate-stage driving device 2D including an actuator such as a linear motor. The substrate stage 2 is supported by an air bearing in a non-contact manner with respect to the upper surface (guide surface) of the substrate-stage surface plate 8. The substrate-stage surface plate 8 is supported on a floor surface FL via anti-vibration devices 10. Position information of the substrate stage 2 (and consequently of the substrate P) is measured by a laser interferometer 15. The laser interferometer 15 measures the position information of the substrate stage 2 in the X-axis, Y-axis and θZ directions by using a reflection surface 16 provided on the substrate stage 2. The exposure apparatus EX further includes a focus/leveling-detecting system (not shown) which is capable of detecting the surface position information (position information in the Z-axis, θX and θZ directions) about a surface of the substrate P supported by the substrate stage 2. The controller 3 drives the substrate-stage driving device 2D, based on the measurement result by the laser interferometer 15 and the detection result by the focus/leveling-detecting system to control the position of the substrate P held by the substrate stage 2. As the focus/leveling-detecting system, it is possible to use a multi-point position detection system disclosed, for example, in U.S. Pat. No. 6,608,681 and the like, which detects height informations (position informations in the Z-axis direction) of the substrate P at a plurality of detection points, respectively. In the embodiment, although at least a part of the plurality of detection points is defined in the exposure area AR, all the detection points may be defined outside the exposure area AR (or liquid immersion area LR). It is also allowable that the laser interferometer 15 is capable of measuring position information of the substrate stage 2 in the Z-axis, θX and θY directions as disclosed, for example, in Published Japanese Translation of PCT International Publication for Patent Application No. 2001-510577 (corresponding to International Publication No. 1999/28790). In this case, it is allowable that the detection result by the focus/leveling-detecting system is not used at least for the position control of the substrate P, or it is allowable that the focus/leveling-detecting system is arranged to be away from the projection optical system PL.

In the embodiment, a recess 2R is formed on the substrate stage 2, and the substrate holder 2H is disposed in the recess 2R. An upper surface 2F of the substrate stage 2, except for the recess 2R, is formed as a flat surface to be approximately at a same height as (flush with) the surface of the substrate P held on the substrate holder 2H. The substrate holder 2H and the substrate stage 2 may be formed as an integrated body.

Figure 2:
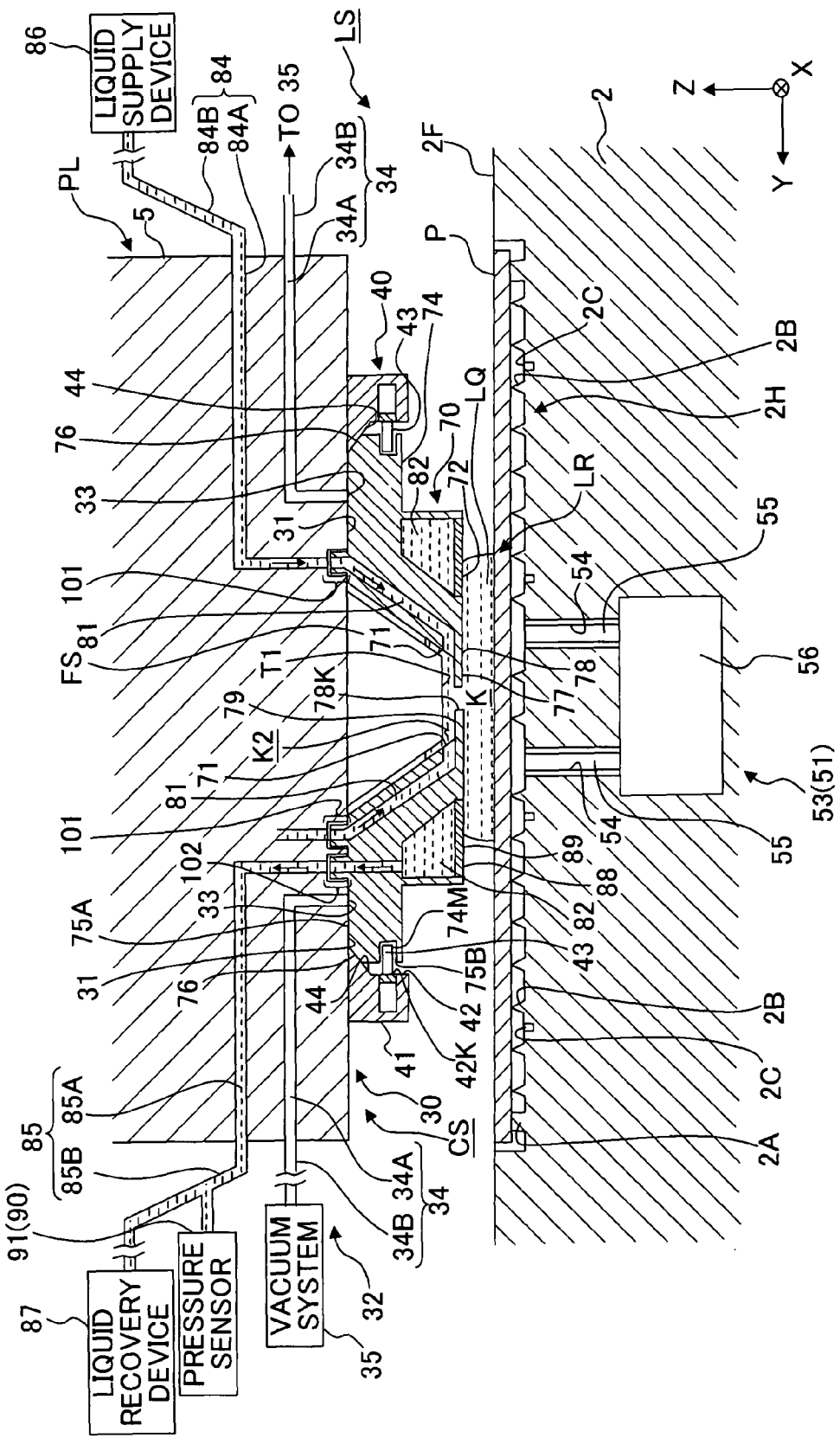
FIG. 2 is a sectional view showing main components of the exposure apparatus according to the first embodiment.
Figure 3:
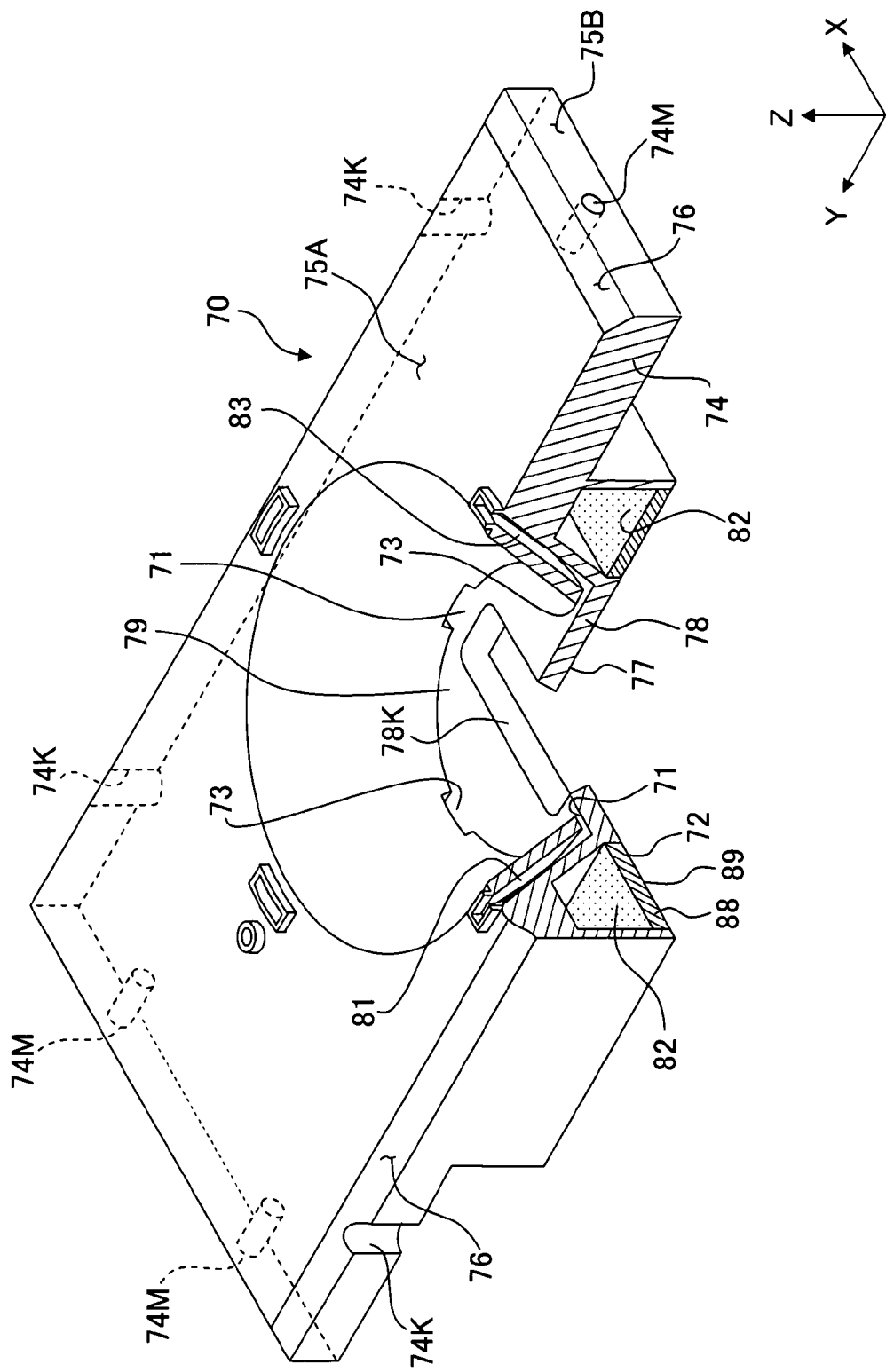
FIG. 3 is a perspective view showing a liquid immersion member according to the first embodiment, with a partial cutout.
Figure 4:
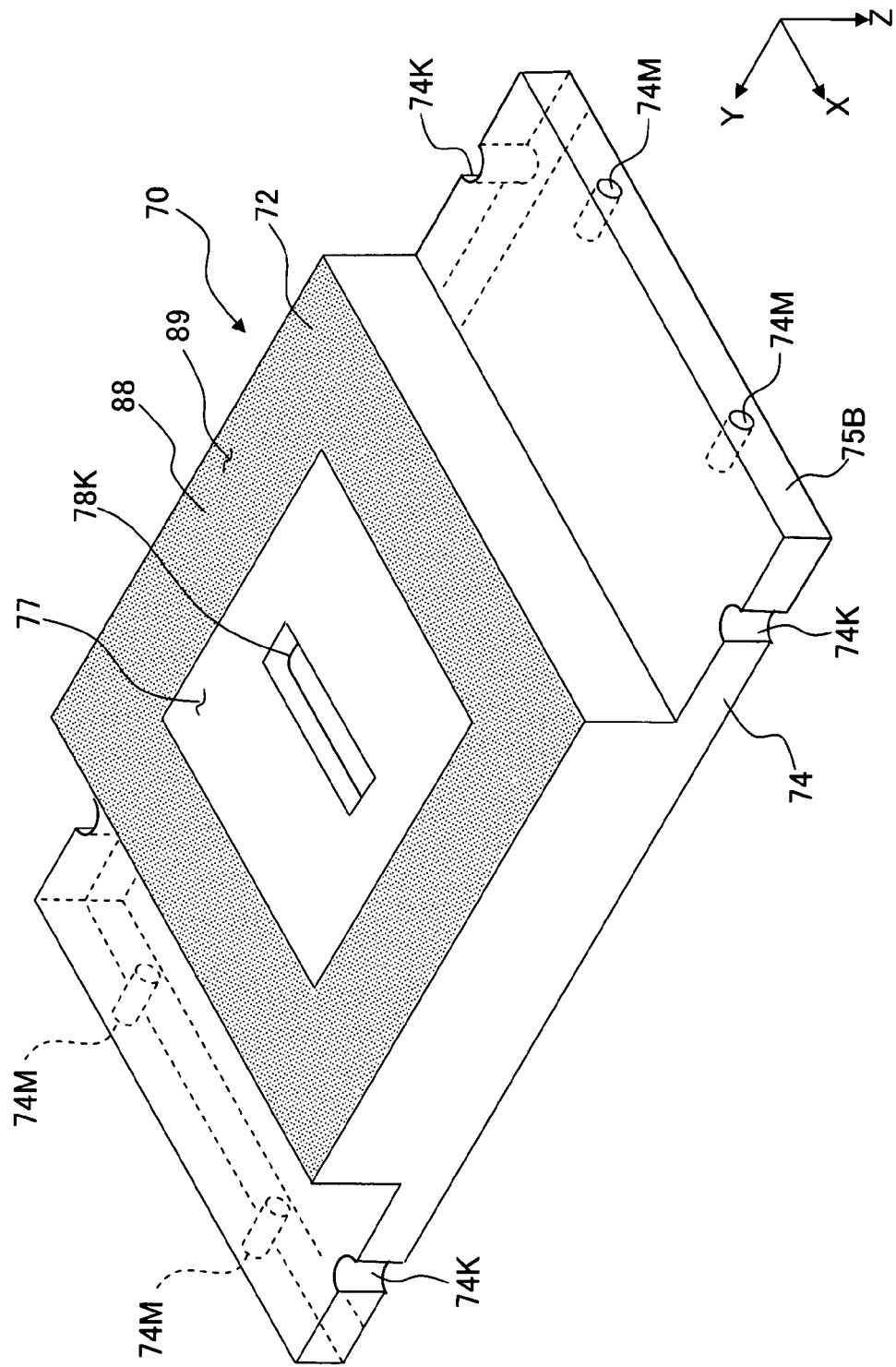
FIG. 4 shows a perspective view illustrating the immersion member according to the first embodiment as viewed from the lower side thereof.

Next, an explanation will be given about the exchange system CS and the liquid immersion system LS with reference to FIGS. 1 to 4. FIG. 2 is a sectional view parallel to the YZ plane and showing the liquid immersion member 70 held to the holding device 30 of the exchange system CS; FIG. 3 is a perspective view showing the liquid immersion member 70 of the liquid immersion system LS, with a partial cutout; and FIG. 4 shows a perspective view illustrating the immersion member 70 as viewed from the lower side thereof.

As shown in FIG. 2, the holding device 30 has a holding surface 31 which makes contact with at least a part of the upper surface 75A of the liquid immersion member 70. The holding surface 31 is provided to surround the final optical element FS. In the embodiment, the holding surface 31 is arranged at a part of the barrel 5 and is substantially parallel to the XY plane. Further, an area, in the upper surface 75A of the liquid immersion member 70, which makes contact with the holding surface 31, is a plane which is substantially parallel to the XY plane.

The holding device 30 has an attraction mechanism 32 which attracts the liquid immersion member 70 by suction. The attraction mechanism 32 has suction ports 33 provided in the holding surface 31 at a plurality of predetermined positions respectively, and a vacuum system 35 connected to the suction ports 33 via a first flow passage 34. In the embodiment, the first flow passage 34 includes a first internal flow passage 34A which is formed inside the barrel 5 and a flow passage which is formed by a first tube member 34B connecting the first internal flow passage 34A and the vacuum system 35. The suction ports 33 are connected to an end of the first internal flow passage 34A, and the other end of the first internal flow passage 34A is connected to the first tube member 34B. The vacuum system 35 includes, for example, a vacuum pump; and the controller 3 is capable of driving the vacuum system 35 of the attraction mechanism 32 to suck a gas through the suction ports 33, thereby attracting, by suction, (suction-attracting) the liquid immersion member 70 by the holding surface 31. Further, the controller 3 is capable of controlling the attraction mechanism 32 including the vacuum system 35 to release the suction-attraction of the liquid immersion member 70 by the attraction mechanism 32, thereby separating (detaching) the liquid immersion member 70 away from the holding surface 31.

As described above, in the embodiment, the controller 3 controls the holding device 30 including the attraction mechanism 32 to thereby attach the liquid immersion member 70 to the holding surface 31 and to detach the liquid immersion member 70 from the holding surface 31 of the holding device 30. It is preferable that a liquid-repelling treatment is performed for the holding surface 31 of the holding device 30 to prevent the liquid from inflowing or entering the inside of the barrel 5. Alternatively, a seal member surrounding the suction ports 33 may be provided to prevent the liquid from inflowing to the inside of the barrel 5.

In the embodiment, although the attraction mechanism 32 of the holding device 30 is provided with the vacuum attraction mechanism which attracts the liquid immersion member 70 by the vacuum suction, the attraction mechanism is not limited to the vacuum attraction mechanism. For example, an electrostatic attraction mechanism using the electrostatic force may be provided to the attraction mechanism 32. By the electrostatic attraction mechanism also, the holding device 30 can attract the liquid immersion 70 detachably.

The liquid immersion member 70, held to the holding device 30, is arranged to be opposite to or facing the substrate P (substrate stage 2) in the vicinity of the final optical element FS via which the exposure light EL is irradiated onto the substrate P. The liquid immersion member 70 is an annular member, and is held by the holding device 30 to thereby be arranged to surround the final optical element FS at a position above or over the substrate P (substrate stage 2). The liquid immersion member 70 held by the holding device 30 and final optical element FS are separate from each other.

The liquid immersion system LS is provided with the liquid immersion member 70 having the supply ports 71 capable of supplying the liquid LQ and the recovery port 72 capable of recovering the liquid LQ; a liquid supply device 86 connected to the supply ports 71 of the liquid immersion member 70 via supply flow passages 81 and a second flow passage 84; and a liquid recovery device 87 connected to the recovery port 72 of the liquid immersion member 70 via a recovery flow passage 82 and a third flow passage 85.

In the embodiment, the second flow passage 84 includes a flow passage formed by a second internal flow passage 84A formed in the barrel 5 and a second tube member 84B connecting the second internal flow passage 84A and the liquid supply device 86. The supply flow passages 81 are formed inside the liquid immersion member 70, the supply ports 71 are each connected to one end (lower end) of one of the supply flow passages 81, and the other end (upper end) of each of the supply flow passages 81 is connected to one end of the second internal flow passage 84A. The other end of the second internal flow passage 84A is connected to the second tube member 84B.

Further, in the embodiment, the third flow passage 85 includes a flow passage formed by a third internal flow passage 85A formed in the barrel 5 and a third tube member 85B connecting the third internal flow passage 85A and the liquid recovery device 87. The recovery flow passage 82 is formed inside the liquid immersion member 70, and the recovery port 72 is connected to one end (lower end) of the recovery flow passage 82, and the other end (upper end) of the recovery flow passage 82 is connected to one end of the third internal flow passage 85A. The other end of the third internal flow passage 85A is connected to the third tube member 85B.

The exposure apparatus EX of the embodiment is provided with a first connection mechanism 101 which connects the other ends of the supply flow passages 81 and the one end of the second internal flow passage 84A, and a second connection mechanism 102 which connects the other end of the recovery flow passage 82 and the one end of the third internal flow passage 85A. When the holding device 30 holds the liquid immersion member 70, namely when the holding surface 31 of the holding device 30 makes contacts with the upper surface 75A of the liquid immersion member 70, the other ends of the supply flow passages 81 and the one end of the second internal flow passage 84A are connected by the first connection mechanism 101, and the other end of the recovery flow passage 82 and the one end of the third internal flow passage 85A are connected by the second connection mechanism 102. On the other hand, when the holding device 30 releases the holding of the liquid immersion member 70, namely when the holding surface 31 of the holding device 30 and the upper surface 75 of the liquid immersion member 70 are separated from each other, the connection between the other ends of the supply flow passages 81 and the one end of the second internal flow passage 84A by the first connection mechanism 101 is released, and the connection between the other end of the recovery flow passage 82 and the one end of the third internal flow passage 85A by the second connection mechanism 102 is released.

Namely, in the embodiment, when the liquid immersion member 70 is held by the holding device 30, the connection between the second flow passage 84 and the supply flow passages 81, the connection between the third flow passage 85 and the recovery flow passage 82 are effected automatically; and when the holding of the liquid immersion member 70 by the holding device 30 is released, the connection between the second flow passage 84 and the supply flow passages 81 and the connection between the third flow passage 85 and the recovery flow passage 82 are released automatically.

Further, each of the first connection mechanism 101 and the second connection mechanism 102 has a seal member such as an O-ring or the like to suppress the leakage of the liquid LQ. In the embodiment, although the holding surface 31 of the holding device 30 and the upper surface 75A of the liquid immersion member 70 are both flat surfaces, at least one of the holding surface 31 and the upper surface 75A may not be a flat surface. Further, it is allowable that the holding surface 31 and the upper surface 75A do not make contact at least partially with each other when the liquid immersion member 70 is held by the holding device 30. Even when there is a gap between the holding surface 31 and the upper surface 75A, the first connection mechanism 101 and the second connection mechanism 102 effect the connection between the second flow passage 84 and the supply flow passages 81 and the connection between the third flow passage 85 and the recovery flow passage 82, respectively.

The operations of the liquid supply device 86 and the liquid recovery device 87 are controlled by the controller 3. The liquid supply device 86 is capable of feeding out the liquid LQ which is clean and of which temperature is adjusted, and the liquid recovery device 87 including a vacuum system and/or the like is capable of recovering the liquid LQ. The liquid supply device 86 is capable of feeding the liquid LQ through the second flow passage 84, the supply flow passages 81 and the supply port 71; and the liquid recovery device 87 is capable of recovering the liquid LQ through the recovery port 72, the recovery flow passage 82 and the third flow passage 85.

As shown in FIGS. 2 and 3, the liquid immersion member 70 has a bottom plate 78 having an upper surface 79 opposite to or facing a lower surface T1 of the final optical element FS. A portion or part of the bottom plate 78 is arranged between the substrate P (substrate stage 2) and the lower surface T1 of the final optical element FS in the Z-axis direction.

Further, as shown in FIGS. 2, 3 and 4, an aperture 78K through which the exposure light EL passes is formed at the central portion of the bottom plate 78. In the embodiment, the exposure light EL has a cross-sectional shape (namely, the projection area AR) which is substantially rectangular in the field of view of the projection optical system PL, and the aperture 78K is formed in a substantially rectangular shape corresponding to the projection area AR.

In the liquid immersion member 70, a lower surface 77 opposite to or facing the surface of the substrate P held to the substrate stage 2 is a flat surface. The lower surface 77 is provided to the bottom plate 78 so as to surround the aperture 78K. In the following explanation, the lower surface 77 of the liquid immersion member 70 is referred to as "land surface 77" as appropriate. The land surface 77 is provided to surround an optical path of the exposure light EL (aperture 78K) between the surface of the substrate P and the lower surface T1 of the final optical element FS of the projection optical system PL. The land surface 77 is arranged at a position closest to the substrate P held to the substrate stage 2 among other parts or components of the liquid immersion member 70, and the land surface 77 is capable of retaining the liquid LQ between the land surface 77 and the surface of the substrate P. The liquid LQ filling the optical path space K makes contact with the bottom plate 78 and the final optical element FS. Further, a space is defined with a predetermined gap between the lower surface T1 of the final optical element FS and the upper surface 79 of the bottom plate 78. In the following explanation, a space, defined inside the liquid immersion member 70, which includes the space between the lower surface T1 of the final optical element FS and the upper surface 79 of the bottom plate 78 is referred to as "internal space K2" as appropriate.

The supply ports 71 are connected to the internal space K2, and are capable of supplying the liquid LQ to the internal space K2. In the embodiment, the supply ports 71 are arranged at predetermined positions, respectively, located outside the aperture 78K through which the exposure light EL is passable, and at both ends in the X-axis direction with the aperture 78K being interposed between the recovery ports 71.

Further, the liquid immersion member 70 has discharge ports 73 for discharging (exhausting) a gas in the internal space K2 to an outside space (including atmospheric space). The discharge ports 73 are connected to the internal space K2. In the embodiment, the discharge ports 73 are arranged at predetermined positions respectively located outside the aperture 78K and at both ends in the Y-axis direction with the aperture 78K being interposed between the discharge ports 73. The gas in the space K2 can be discharged to the outside space via the discharge ports 73 and a discharge flow passage 83 provided inside the liquid immersion member 70.

The recovery port 72 is provided at a position over or above the substrate P held to the substrate stage 2 so as to be opposite to the surface of the substrate P. The recovery port 72 is provided outside the supply ports 71 and the discharge ports 73 with respect to the aperture 78K, and is formed in an annular shape to surround the land surface 77, the supply ports 71 and the discharge ports 73. A porous member 88 is arranged in the recovery port 72. The porous member 88 has a plurality of holes formed therein and a lower surface 89 opposite to the substrate P held to the substrate stage 2. In the embodiment, the lower surface 89 of the porous member 89 is substantially flat, and the land surface 77 and the lower surface 89 of the porous member 88 are approximately flush with each other (are provided at approximately same positions in the Z-axis direction). It should be noted that an optimum value (allowable range) for the pressure in the recovery flow passage 82 can be determined in advance by, for example, experiment or simulation.

The land surface 77 is lyophilic with respect to the liquid LQ. In the embodiment, the bottom plate 78 forming the land surface 77 is made of titanium and is lyophilic (hydrophilic). In the embodiment, the contact angle on the land surface 77 with respect to liquid LQ is, for example, not more than 40 degrees. It is also allowable to perform a surface treatment for the land surface 77 to enhance the lyophilicity thereof. Also, in the embodiment, the porous material 88 is a mesh member made of titanium and is lyophilic (hydrophilic) with respect to the liquid LQ. It should be noted that a surface treatment may be performed for the porous member 88 to enhance the lyophilicity thereof. The material for forming the bottom plate 78 and the porous member 88 is not limited to titanium, and may be, for example, aluminum, ceramics, or the like.

The liquid immersion member 70 of the embodiment is provided with a flange 74. The flange 74 is formed on the upper portion of the liquid immersion member 70 to extend both in the +Y and −Y directions.

In the embodiment, the upper surface 75A and a side surface 75B of the liquid immersion member 70 are connected by inclined surfaces (beveled surfaces) 76. The inclined surfaces 76 are formed at positions on the +X side, −X side, +Y-side and −Y side of the upper surface 75A respectively, and at a predetermined angle with respect to the holding surface 31.

In addition, in the liquid immersion member 70, cutouts 74K are formed on the side surface 75B, of the flange 74, at a plurality of predetermined positions respectively. The cutouts 74K are formed to extend in the thickness direction of the flange 74 (Z-axis direction). In the embodiment, the cutouts 74K are formed on the side surface 75B such that two pieces of the cutouts 74K are located at predetermined positions on the +X side of the flange 74 and two pieces of the cutout 74K are located at predetermined positions on the −X side of the flange 74. Accordingly, in total, four pieces of the cutouts 74K are formed on the flange 74.

Further, in the liquid immersion member 70, recesses (concave portions) 74M are formed on the side surface 75B at predetermined positions respectively. In the embodiment, the recesses 74M are formed on the side surface 75B such that two pieces of the recesses 74M are located at predetermined position on the +Y side of the flange 74 and two pieces of the recesses 74M are located at predetermined position on the −Y side of the flange 74. Accordingly, in total, four pieces of the recesses 74M are formed on the flange 74.

For the purpose of preventing the liquid LQ from inflowing into the barrel 5, it is preferable that a liquid-repellent treatment is performed for the upper surface 75A, side surface 75B and inclined surfaces 76 of the liquid immersion member 70. It is particularly preferable that the liquid-repellent treatment is performed for the upper surface 75A of the liquid immersion member 70 in order to prevent the liquid from inflowing between the upper surface 75A of the liquid immersion member 70 and the holding surface 31 of the holding device 30. In this case, the liquid-repellent treatment is preferably performed also for the holding surface 31 of the holding device 30 as described above. As the liquid-repellent treatment, for example, a liquid-repellent film may be coated on the holding surface 31 and/or the upper surface 75A. As the liquid-repellent film, it is allowable to use, for example, a fluorine-based resin material such as polytetrafluoroethylene ("Teflon", trade name), an acryl-based resin material, a silicon-based resin material or the like. By coating such a liquid-repellent film on the above-described surface and/or surfaces, it is possible to make the contact angle with respect to the liquid LQ to be not less than 90 degrees. The liquid-repellent film may also be provided on the side surface 75B and the recesses 74M of the flange 74 of the liquid immersion member 70 and on a support member 43. For preventing the inflow of the liquid, it is also allowable to adopt a method different from the liquid-repellent treatment, such as using a seal member.

As shown in FIG. 2, the exposure apparatus EX includes a support mechanism 40 which is provided separately from the holding device 30 and is capable of supporting the liquid immersion member 70. The support mechanism 40 has a base member 41 provided to surround the liquid immersion member 70; and a support member 43 arranged in an opening 42K which is formed in an inner surface 42 of the base member 41, the support member 43 being detachably insertable to the recess 74M provided in the side surface 75B of the liquid immersion member 70. The base member 41 is arranged at a predetermined position with respect to the holding surface 31. In the embodiment, the base member 41 of the support mechanism 40 is arranged on the lower surface of the barrel 5 so as to surround the holding surface 31. The support member 43 is provided as a plurality of (four pieces) of support members 43 corresponding to the plurality of recesses 74M. Each of the support members 43 is a pin-shaped member and is provided such that an end thereof is movable in the Y-axis direction by an actuator such as an air cylinder or the like.

The inner surface 42 of the base member 41 includes inclined surfaces (beveled surfaces) 44 corresponding to the inclined surfaces (beveled surfaces) 76 of the liquid immersion member 70. The inclined surfaces 44 of the base member 41 and the inclined surfaces 76 of the liquid immersion member 70 are made to have contact to thereby adjust a positional relationship between the base member 41 and the liquid immersion member 70, and to further adjust a positional relationship between the liquid immersion member 70 and the holding surface 31 of the holding device 30 in a desired state (to position and align the liquid immersion member 70 and the holding surface 31 in a desired positional relationship). Therefore, the inclined surfaces 76 of the liquid immersion member 70 and the inclined surfaces 44 of the base member 41 function as an alignment device.

Further, the support mechanism 40 is capable of supporting the liquid immersion member 70 by inserting the support members 43 into the recesses 74M of the liquid immersion member 70, respectively. Furthermore, the controller 3 is capable of supporting the liquid immersion member 70 by using the supporting mechanism 40 when the liquid immersion member 70 is not held by the holding device 30. When the liquid immersion member 70 is released (detached) from the holding device 30 due to, for example, the failure of the holding device 30 or the like, the support mechanism 40 supports the liquid immersion member 70 with the support members 43, to thereby prevent the liquid immersion member 70 from falling. Namely, the support member 43 functions as a safety mechanism for preventing the liquid immersion member 70 from falling. In such a manner, the support mechanism 40 supports the liquid immersion member 70 independently from the holding device 30. On the other hand, the support mechanism 40 is capable of releasing the liquid immersion member 70 from being supported to the support mechanism 40, by pulling the support members 43 from the recesses 74, of the liquid immersion member 70, respectively.

In FIG. 2, the substrate holder 2H supporting the substrate P has a surrounding wall 2A which is arranged at the upper surface of a base member of the substrate holder 2H and which functions as a seal member; support members 2B arranged inside the surrounding wall 2A to support the back surface of the substrate P; and suction ports 2C which are provided on the upper surface of the base member at positions inside the surrounding wall 2A. The controller 3 drives a suction device including a vacuum system connected to the suction ports 2C to suck a gas in a space surrounded by the back surface of the substrate P, the surrounding wall 2A and the base member, so as to negatively pressurize the space, thereby holding, by suction-attraction, the back surface of the substrate P with the support members 2B. On the other hand, the controller 3 is capable of releasing or detaching the substrate P from the substrate holder 2H by stopping the suction operation performed by the suction device connected to the suction ports 2C. In such a manner, in the embodiment, it is possible to attach the substrate P to the substrate holder 2H by performing the suction operation by using the suction ports 2C and to detach the substrate P from the substrate holder 2H by stopping the suction operation of the suction ports 2C. The substrate holder 2H in the embodiment includes a so-called pin-chuck mechanism. Namely, the support member 2B includes a large number of pin-shaped members.

Next, the transport device 50 will be explained with reference to FIGS. 1 and 2. The transport device 50 is capable of transporting the liquid immersion member 70 between a first position PS1 and a second position PS2 different from the first position PS1. In the embodiment, the holding device 30 is arranged at the first position PS1, and an accommodating station 20 capable of accommodating the liquid immersion member 70 is arranged at the second position PS2. The transport device 50 is capable of transporting the liquid immersion member 70 between the holding device 30 and the accommodating station 20.

The transport device 50 is provided with a first sub-transport system 51 and a second sub-transport system 52. The first sub-transport system 51 includes a moving mechanism 53 which performs delivery and receipt of the liquid immersion member 70 to and from the holding device 30 at the first position PS1.

The moving mechanism 53 is arranged in the substrate stage 2. As shown in FIG. 2, the moving mechanism 53 is provided with a pin-shaped member 55 disposed in an opening 54 which is formed in the upper surface of the base member of the substrate holder 2H in the substrate stage 2; and a driving device 56 which moves the pin-shaped member 55 in the Z-axis direction (moves upwardly and downwardly the pin-shaped member 55). The pin-shaped member 55 is provided as a plurality of (for example, three pieces of) pin-shaped members 55, and the driving device 56 is capable of moving each of the pin-shaped members 55 upwardly and downwardly.

Figure 5:
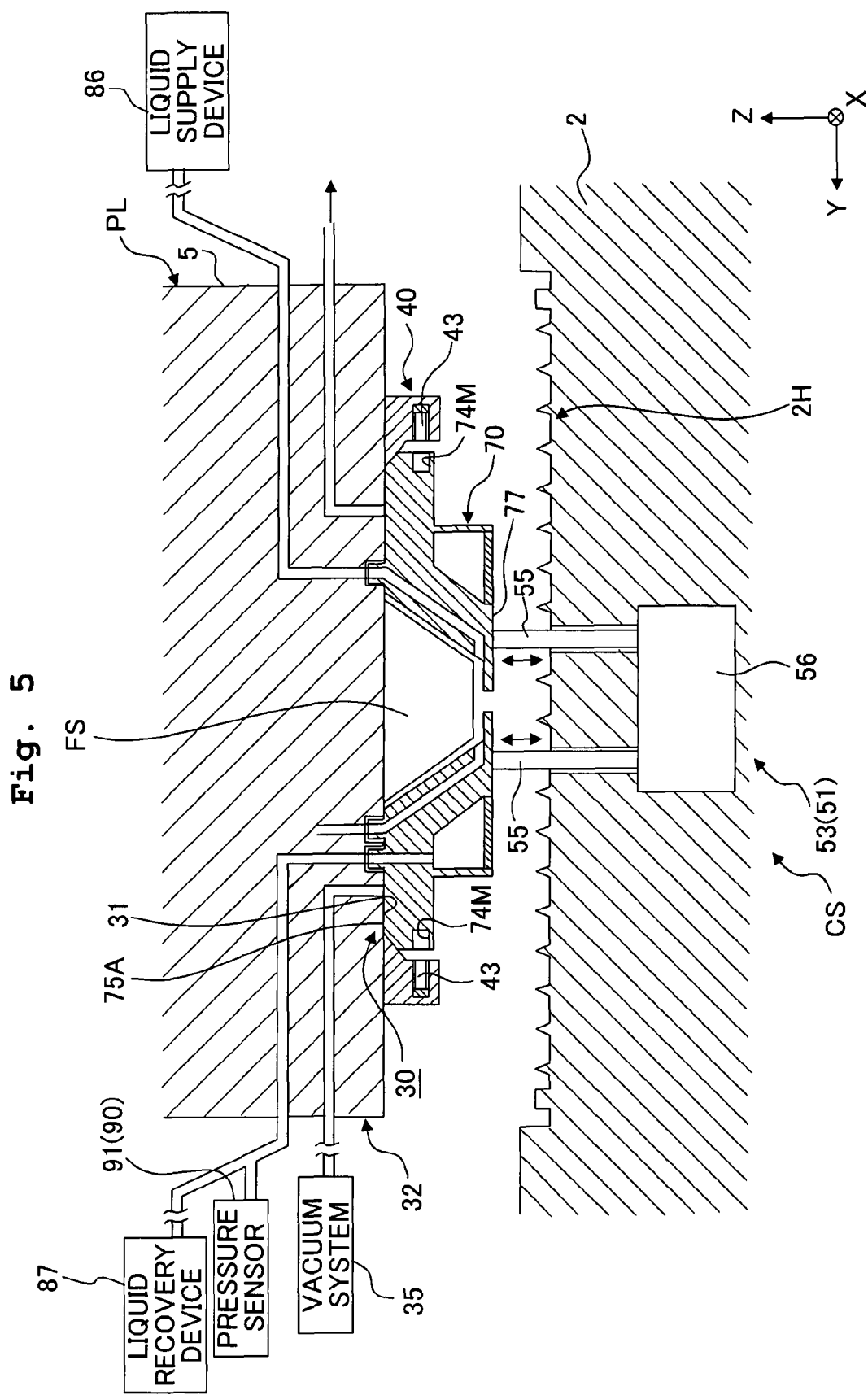
FIG. 5 shows an example of operation of an exchange system according to the first embodiment.

FIG. 5 shows a state in which the pin-shaped members 55 support the liquid immersion member 70 at the first position PS1. As shown in FIG. 5, the pin-shaped members 55 of the moving mechanism 53 are capable of holding the land surface 77 of the liquid immersion member 70 which is released from the holding device 30. A suction port is provided on the upper surface of each of the pin-shaped members 55, which makes it possible for the pin-shaped members 55 to hold, by the suction-attraction, the land surface 55 of the liquid immersion member 70. When the liquid immersion member 70 is to be supported by the pin-shaped members 55 of the moving mechanism 53, the substrate P is not placed in the substrate holder 2H.

The moving mechanism 53 of the first sub-transport system 51 is capable of supporting the liquid immersion member 70 and moving the liquid immersion member 70 in the Z-axis direction, and is capable of adjusting a distance (spacing distance) between the holding surface 31 of the holding device 30 (namely, the lower surface T1 of the final optical element FS) and the upper surface 75A of the liquid immersion member 70. As shown in FIG. 5, the controller 3 pulls out (retract) the support members 43 of the support mechanism 40 from the recesses 74M of the liquid immersion member 70; releases the liquid immersion member 70 from the suction-attraction by the attraction mechanism 32 of the holding device 30; and supports, at the first position PS1, the land surface 77 of the liquid immersion member 70 by the pin-shaped members 55 of the moving mechanism 53. The controller 3 moves the pin-shaped members 55 in the −Z-axis direction with the driving device 56 while supporting the land surface 77 of the liquid immersion member 70 with the pin-shaped members 55 of the moving mechanism 53. By doing so, the controller 3 can move the liquid immersion member 70 in the −Z-axis direction from the first position PS1, thereby making it possible to separate the liquid immersion member 70 away from the holding device 30.

In addition, by controlling the moving mechanism 53 to move the pin-shaped members 55 in the +Z-axis direction, the controller 3 can move the liquid immersion member 70, supported by the pin-shaped members 55, in the +Z-axis direction upwardly up to the first position PS1 such that the liquid immersion member 70 approaches toward (moves toward) the holding device 30. Further, the controller 3 is capable of delivering the liquid immersion member 70 from the moving mechanism 53 to the holding device 30 by inserting the support members 43 of the support mechanism 40 into the recesses 74M of the liquid immersion member 70 and by holding the liquid immersion member 70 by the attraction mechanism 32 of the holding device 30. As described above, the first sub-transport mechanism 51 including the moving mechanism 53 is capable of performing at the first position PS1 the delivery and receipt of the liquid immersion member 70 to and from the holding device 30.

Further, the transport mechanism 53 including the pin-shaped members 55 is arranged in the substrate stage 2 movable in the X-axis and Y-axis directions; and the controller 3 is capable of moving the liquid immersion member 70 from a position just below the projection optical system PL and of moving the liquid immersion member 70 to the position just below the projection optical system PL, by moving the substrate stage 2 at least in the Y-axis direction in a state that the liquid immersion member 70 is supported by the pin-shaped members 55 or in a state that the liquid immersion member 70 is placed in the substrate stage 2. Namely, upon moving the liquid immersion member 70 between the first and second positions PS1 and PS2, even when the substrate stage 2 with the immersion member 70 placed or arranged therein is moved in the XY plane, the upper surface 75A of the liquid immersion member 70 is located at a position lower than the lower surface T1 of the final optical element FS, thereby preventing the liquid immersion member 70 from making contact with the final optical element FS. This makes it possible the loading and unloading of the liquid immersion member 70, for example, for cleaning (washing) or for exchange of the liquid immersion member 70 during the maintenance or the like of the exposure apparatus EX. Namely, it is possible to unload the liquid immersion member 70 from the body of the exposure apparatus EX which performs the exposure for the substrate P via the projection optical system PL and to load the liquid immersion member 70 which has been cleaned or an exchanged liquid immersion member 70 to the body of the exposure apparatus EX. It should be noted that in the embodiment, although the position at which the delivery and receipt of liquid immersion member 70 is performed between the holding device 30 and the pin-shaped members 55 is the first position PS1, a position at which the substrate stage 2 is arranged in the XY plane at the time of the delivery and receipt will be also referred to as the first position PS1 in the following explanation though this position is different in a strict sense from the first position PS1 with respect to the Z-axis direction.

In the embodiment, upon attaching and detaching (loading and unloading) the liquid immersion member 70, the final optical element FS and the liquid immersion member 70 are moved relative to each other in the Z-axis direction by the moving mechanism 53. However, the movement of the final optical element FS and the liquid immersion member 70 is not limited to this. For example, it is allowable to move the substrate stage 2 placing the liquid immersion member 70 therein and/or the projection optical system PL in the Z-axis direction. Further, the member which supports the liquid immersion member detached (released) from the holding device 30 or the liquid immersion member to be attached (held) by the holding device 30, namely the member at which the delivery and receipt of the liquid immersion member 70 is performed with respect to the holding device 30, is not limited to the pin-shaped member 55. For example, the member may be the support members 2B of the substrate holder 2H, a movable member (for example, a transport arm) movable in the XY plane, or the like.

In the embodiment, the moving mechanism 53 is also used for transporting the substrate P. Namely, upon loading and unloading the substrate P with respect to the substrate holder 2H, the moving mechanism 53 is capable of holding the back surface of the substrate P and moving the substrate P in the Z-axis direction by moving the pin-shaped members 55 upwardly and downwardly with the driving device 56.

The second sub-transport system 52 includes a first transport mechanism 61 and a second transport mechanism 62. The second sub-transport system 52 is disposed between the first position PS1 and the second position PS2. It is not necessarily indispensable that the second sub-transport system 52 is provided on a straight line connecting the first and second positions PS1 and PS2. The second sub-transport system 52 may be arranged such that the second sub-transport system 52 can transport the liquid immersion member 70 between the first and second positions PS1 and PS2. In the embodiment, the first transport system 61 is arranged in the barrel-surface plate 7 of the first column CL1, at the +Y side of the barrel 5; and the second transport system 62 is arranged on the floor surface FL, at the +Y side of the substrate-stage surface plate 8.

The second sub-transport system 52, which includes the first and second transport mechanisms 61 and 62, is capable of performing the delivery and receipt of the liquid immersion member 70 at a third position PS3 different from the first and second positions PS1 and PS2. In addition, the second sub-transport system 52 is capable of transporting the liquid immersion member 70 between the third position PS3 and the second position PS2. The first transport mechanism 61 has first arms 63 capable of holding the flange 74 of the liquid immersion member 70; and the second transport mechanism 62 has a second arm 64 capable of holding the land surface (lower surface) 77 of the liquid immersion member 70. Each of the first arms 63 of the first transport mechanism 61 and the second arm 64 of the second transport mechanism 62 is movable in the six degrees of freedom in the X-axis, Y-axis, Z-axis, θX, θY, and θZ directions. The delivery and receipt of the liquid immersion member 70 can be performed between the first and second transport mechanisms 61 and 62. The driving operation for the first and second arms 63 and 64 will be described later on.

The first transport mechanism 61 of the second sub-transport system 52 is arranged at a position in the vicinity of the third positions PS3, and the moving mechanism 53 of the first sub-transport system 51 is movable between the first position PS1 and the position in the vicinity of the third position PS3 by the movement of the substrate stage 2. Further, the transport device 50 is capable of performing, at the third position PS3, the delivery and receipt of the liquid immersion member 70 between the first sub-transport system 51 including the moving mechanism 53 and the second sub-transport system 52 including the first transport mechanism 61. As described above, in the embodiment, the transport device 50 has the first sub-transport system 51 and the second sub-transport system 52 which perform the delivery and receipt of the liquid immersion member 70 at the third position PS3 which is different from the first position PS1 at which the holding device 30 is arranged and the second position PS2 at which the accommodating station 20 is arranged.

Further, an opening 21 is formed in the chamber 19 at a position in the vicinity of the accommodating station 20, and a door 22 is arranged in the opening 21. The second arm 64 of the second transport mechanism 62 can make access to the accommodating station 20. The controller 3 opens the door 22 to open the opening 21 when making the second arm 64 access to the accommodating station 20. For example, the second arm 64 can take a liquid immersion member 70 accommodated in the accommodating station 20 from the accommodating station 20, and the second arm 64 can accommodate a liquid immersion member 70 which is held to the second arm 64 to the accommodating station 20. In such a manner, the second transport mechanism 62 of the transport device 50 performs the delivery and receipt of the liquid immersion member 70 between the second position PS2 and the third position PS3.

The transport device 50 of the embodiment is also capable of transporting the substrate P. The controller 3 is capable of receiving a substrate P, which has been transported to the chamber 19 from a substrate-accommodating station (not illustrated) or a peripheral device such as a coater or the like and which is to be subjected to the exposure process, by the second transport mechanism 62 of the second sub-transport system 52. The second transport mechanism 62 can delivery the substrate P held thereto to the first transport mechanism 61. Further, the first transport mechanism 61 can deliver, for example at the third position PS3, the substrate P held thereon to the moving mechanism 53, of the first sub-transport system 51, which includes the pin-shaped members 55 and which is provided in the substrate stage 2. When the moving mechanism 53 of the first sub-transport system 51 receives the substrate P from the first transport mechanism 61 of the second sub-transport system 52, the pin-shaped members 55 are raised (moved upwardly), and the first transport mechanism 61 of the second sub-transport system 52 delivers the substrate P to the raised pin-shaped members 55. Then, the controller 3 controls the driving device 56 of the moving mechanism 53 to move the pin-shaped members 55 downwardly, thereby making it possible to place the substrate P on the substrate holder 2H. On the other hand, upon unloading the exposed substrate P from the substrate stage 2, the controller 3 makes the substrate stage 2 move to the third position PS3, controls the driving device 56 of the moving mechanism 53 to move the pin-shaped members 55 upwardly, and makes the substrate P to be separated from the substrate holder 2H. The substrate P, separated from the substrate holder 2H, is delivered at the third position PS3 to the first transport mechanism 61 of the second sub-transport system 52. The first transport mechanism 61 delivers the substrate P to the second transport mechanism 62; and then the second transport mechanism 62 delivers the substrate P to an unillustrated substrate-accommodating station or a periphery device such as a developer or the like. In the embodiment, although the transport device 50 is made common for transporting the liquid immersion member 70 and the substrate P, it is also allowable to provide transport devices dedicated for the liquid immersion member 70 and the substrate P, respectively. Further, the transport device 50 is not limited to the construction as described above. For example, it is allowable to provide a movable member (for example, a transport arm) movable between the first and third positions PS1 and PS3 (or between the first and second positions PS1 and PS2) to perform the transport of the liquid immersion member 70 by the movable member. In this case, the delivery and receipt of the liquid immersion member 70 may be performed between the holding device 30 and the movable member.

Further, as shown in FIG. 2, the exposure apparatus EX is provided with a detector 90 which detects the state of the liquid immersion member 70. The detector 90 includes a pressure sensor 91 which detects the pressure in the flow passage connected to the recovery port 72 of the liquid immersion member 70. In the embodiment, the pressure sensor 91 is provided for the third tube member 85B of the third flow passage 85.

The controller 3 is capable of detecting, by using the pressure sensor 91, a value of the pressure in the recovery flow passage 82 connected to the recovery port 72, and is capable of obtaining the difference between the pressure in the recovery flow passage 82 and the pressure in the outside space based on result of the detection performed by the pressure sensor 91. Thus, the controller 3 is capable of judging whether or not the recovery port 72 of the liquid immersion member 70 is recovering the liquid LQ in a desired state, based on the result of detection by the pressure sensor 91.

Further, the detector 90 includes an imaging device 92 which can observe the state of a surface (mainly the lower surface) of the liquid immersion member 70. As shown in FIG. 1, in the embodiment, the imaging device 92 is disposed in the substrate stage 2 at a position different from that of the substrate holder 2H.

Figure 6:
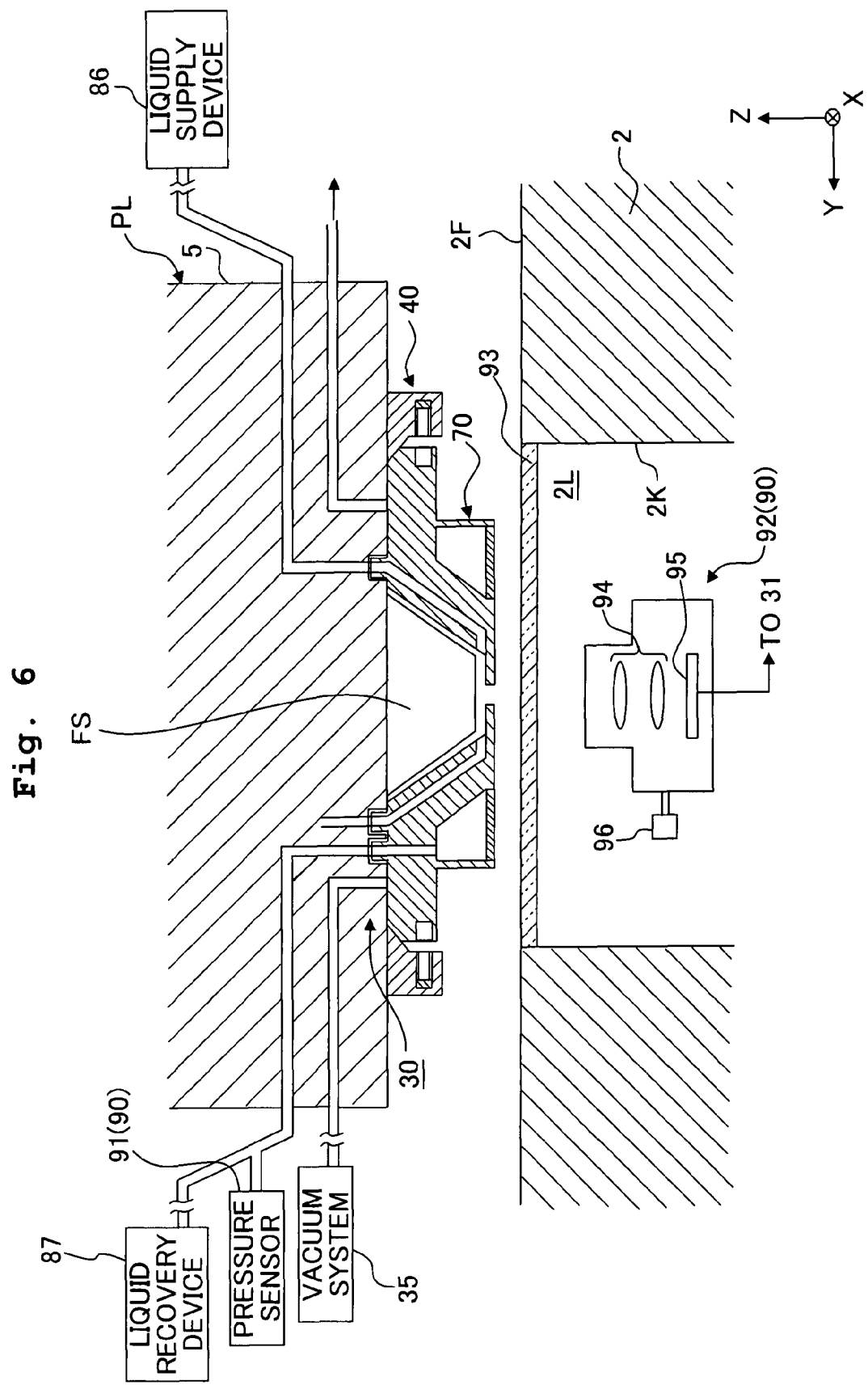
FIG. 6 is a schematic view for explaining a detector according to the first embodiment.

FIG. 6 shows a schematic view showing the imaging device 92. An opening 2K is formed in the substrate stage 2 at a partial area on the upper surface 2F. A transparent member 93 made of silica glass, calcium fluoride, or the like is arranged in the opening 2K. The material for forming the transparent member 93 can be selected appropriately depending on the wavelength of a light guided to an imaging element which will be described later on. The upper surface of the transparent member 93 (a detection surface of the imaging device 92) is a flat surface and is substantially flush with the upper surface 2F of the substrate stage 2.

An internal space 2L connected to the opening 2K is defined in the substrate stage 2, and the imaging device 92 is disposed in the internal space 2L. The imaging device 92 is provided with an optical system 94 arranged at a position below or under the transparent member 93, and an imaging element 95 such as CCD or the like. The imaging element 95 is capable of obtaining, via the transparent member 93 and the optical system 94, an optical image (image) of the lower surface of the liquid immersion member 70 (including the land surface 77 and the lower surface 89 of the porous member 88). The imaging element 95 is also capable of obtaining an optical image (image) of the liquid LQ, the lower surface of the final optical element FS and the like. The imaging element 95 converts the obtained image to an electric signal, and outputs the electric signal (image information) to the controller 3. The imaging device 92 also has an adjusting mechanism 96 which is capable of adjusting a focus position of the optical system 94. It is allowable that not all of the imaging device 92 is disposed in the substrate stage 2, and that the imaging device 92 may be disposed in a measuring stage (not illustrated) which can be provided independently from the substrate stage 2.

Figure 23:
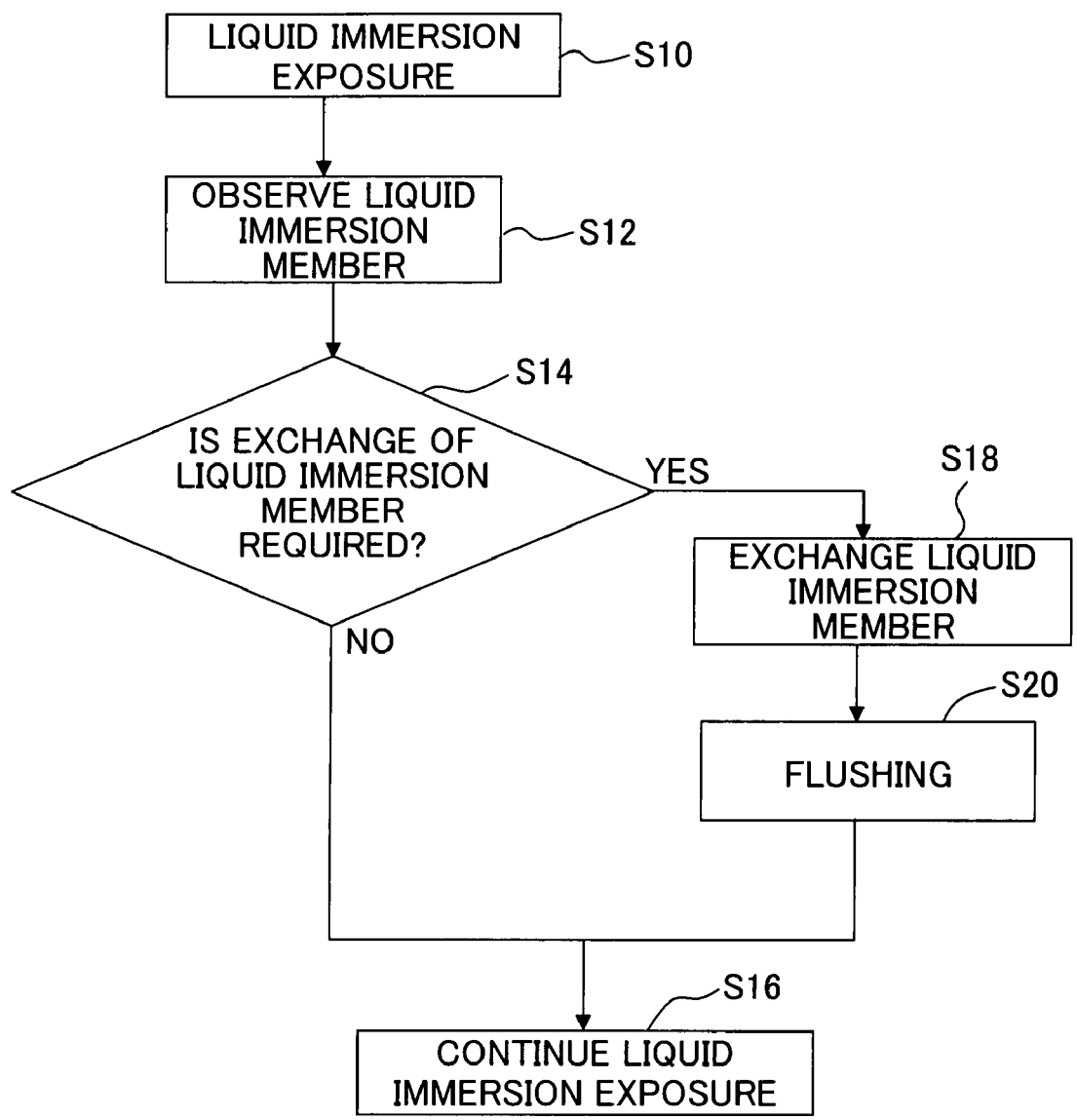
FIG. 23 is a flow chart showing an example of a maintenance and exposure method which includes exchange operation for the liquid immersion member.

Next, an explanation will be made with reference to FIG. 23 about an example of exposure method for exposing the substrate P by using the exposure apparatus EX constructed as described above and the maintenance method for the exposure apparatus EX. Upon exposing the substrate P with an image of the pattern of the mask M, the controller 3 drives each of the liquid supply device 86 and the liquid recovery device 87 so as to fill, with the liquid LQ, the optical path space K which includes the optical path for the exposure light EL. The liquid LQ fed out from the liquid supply device 86 flows through the second flow passage 84, and then is supplied to the internal space K2 from the supply ports 71 via the supply flow passages 81 of the liquid immersion member 70. The liquid LQ, supplied from the supply ports 71 to the internal space K2, fills the internal space K2 and then inflows via the opening 78K to a space between the land surface 77 and the substrate P (substrate stage 2) to fill the optical path space K. In such a manner, the liquid immersion system LS supplies the liquid LQ from the supply ports 71 to the internal space K2 between the final optical element FS and the bottom plate 78 to thereby fill, with the liquid LQ, the optical path space K including the optical path for the exposure light EL between the substrate P and the final optical element FS (projection optical system PL). At this time, the liquid recovery device 87 recovers a predetermined amount of the liquid LQ per unit time. The liquid recovery device 87 including the vacuum system negatively pressurizes the recovery flow passage 82 and thus is capable of recovering the liquid LQ existing between the substrate P and the recovery port 72 (porous member 88) via the recovery port 72. The liquid LQ filled in the optical path space K inflows into the recovery flow passage 82 via the recovery port 72 of the liquid immersion member 70, flows through the third flow passage 85, and then is recovered by the liquid recovery device 87. The controller 3 controls the liquid immersion system LS to perform the liquid supply operation by the liquid supply device 86 and the liquid recovery operation by the liquid recovery device 87 in parallel, thereby filling the optical path space K with the liquid LQ and forming the liquid immersion area LR of the liquid LQ locally on a part of the substrate P. Then, the controller 3 makes the exposure light EL to be irradiated onto the substrate P while moving the substrate P in the Y-axis direction with respect to the optical path space K in a state that the liquid LQ is filled in the optical path space K, thereby executing the liquid immersion exposure (S10).

The controller 3 supports the liquid immersion member 70 by the holding device 30 at least during the operation for forming the liquid immersion area LR (including during the exposure for the substrate). Further, the controller 3 inserts the support members 43 into the recesses 74M of the liquid immersion member 70 respectively. This makes it possible to prevent the liquid immersion member 70 from falling even when, for example, during the operation for forming the liquid immersion area LR, the liquid immersion member 70 is released from the holding device 30 or the holding force of the holding device 30 is weakened or the like due to any reason. Accordingly, it is possible to prevent the falling of the liquid immersion member 70, and consequently prevent any failure or problem, such as the damage of the substrate stage 2, the substrate-stage surface plate 8 and the liquid immersion member 70 which would be otherwise caused by the falling of the liquid immersion member 70.

There is a possibility that the liquid immersion member 70 is degraded and/or polluted. For example, the liquid LQ of the liquid immersion area LR makes contact with both the liquid immersion member 70 and the surface of the substrate P. There is a possibility that the photosensitive material of the substrate P or a material forming the top coat layer etc. coated on the photosensitive material enters into and mixes with the liquid LQ as a foreign matter, and that the foreign matter adheres to the liquid immersion member 70 and pollutes the liquid immersion member 70. Alternatively, there is a possibility that a foreign matter floating in the air adheres to the liquid immersion member 70 and pollutes the liquid immersion member 70. When the land surface 77 of the liquid immersion member 70 is polluted, the liquid LQ cannot be retained satisfactorily between the liquid immersion member 70 and the substrate P, which in turn might cause the outflow of the liquid LQ upon moving the substrate P with respect to the liquid immersion member 70. On the other hand, when the porous member 88 arranged in the recovery port 72 of the liquid immersion member 70 is polluted, the liquid LQ cannot be recovered satisfactorily, which in turn might prevent the liquid from being satisfactorily retained between the liquid immersion member 70 and the substrate P. Further, there is a possibility that the foreign matter adhered to the liquid immersion member 70 enters into and mixes with the liquid LQ during the exposure for the substrate P, and that the foreign matter floats in the optical path for the exposure light EL and/or adheres onto the substrate P. Furthermore, there is a possibility that the liquid immersion member 70 is damaged due to any reason. When the liquid immersion member 70 is continuously used with such a problem or problems (when liquid immersion member 70 in an abnormal state is continuously used), there is a possibility that the liquid immersion area LR cannot be formed in a desired state, which consequently causes the degradation of the exposure accuracy and/or the measurement accuracy.

In view of above situation, the exposure apparatus EX of the embodiment automatically performs the exchange of the liquid immersion member 70 by using the exchange system CS.

Next, an explanation will be given about an operation for exchanging the liquid immersion member 70 with reference to the schematic view of FIGS. 7 to 16. Here, the exchange operation for the liquid immersion member 70 is performed when the substrate P is not being exposed. Further, when the exchange operation for the liquid immersion member 70 is performed, the substrate P is not placed on the substrate holder 2H.

Figure 7:
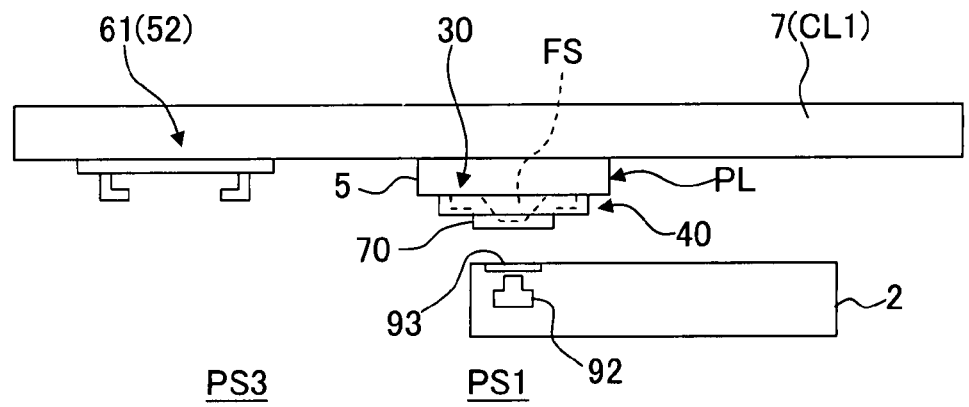
FIG. 7 is a schematic view for explaining the operation of the exchange system according to the first embodiment.

The controller 3 detects the state of the liquid immersion member 70 by using the detector 90. In the embodiment, as shown in FIG. 7, the controller 3 adjusts the position of the substrate stage 2 so that the transparent member 93 arranged in the substrate stage 2 is opposite to or facing the lower surface of the liquid immersion member 70; and the controller 3 observes, by using the imaging device 92, the state of the surface of the liquid immersion member 70, specifically the state of the land surface 77 of the liquid immersion member 70 and the porous member 88 (S12). In the embodiment, the controller 3 observes the state of the surface of the liquid immersion member 70 by using the imaging device 92 after recovering all the liquid LQ in the liquid immersion area LR (after also removing all the liquid inside the liquid immersion member 70, the substrate stage 2 and the like). It should be noted that, during the observation operation using the imaging device 92, the liquid LQ may be filled between the liquid immersion member 70 and the upper surface 2F of the substrate stage 2 (transparent member 93). In this case, the imaging device 92 observes the state of the liquid immersion member 70 through the liquid LQ; and when the liquid immersion member 70 is to be exchanged after completing the observation operation using the imaging device 92, the operation for recovering all the liquid of the liquid immersion area LR is executed.

Further, in the embodiment, the controller 3 performs the detection operation for detecting the state of the liquid immersion member 70 by using the imaging device 92 of the detector 90 every time as the exposure process is performed for predetermined pieces of the substrate. The controller 3 may perform the detection operation of the state of the liquid immersion member 70 using the imaging device 92 of the detector 90 at an interval of a predetermined period of time.

The image information imaged or photographed by the imaging device 92 is outputted to the controller 3. The controller 3 judges, based on the result of the detection by the imaging device 92, whether or not the exchange of the liquid immersion member 70 is required (S14). Then, the controller 3 performs the exchange operation of the liquid immersion member 70 based on the detection result of the imaging device 92. For example, the controller 3 performs image-processing for the image information imaged by the imaging device 92 and judges whether or not the exchange of the liquid immersion member 70 is required, based on the result of the image-processing.

In the controller 3, information about an allowable range regarding the pollution state of the liquid immersion member 70 is stored in advance. The controller 3 judges whether or not the exchange of the liquid immersion member 70 is required, based on the stored information and the result of the image-processing. For example, when the controller 3 judges that the pollution state of the liquid immersion member 70 is within the allowable range, based on the stored information and the result of the image-processing, the controller 3 continues the operation for the liquid immersion exposure using this liquid immersion member 70 without performing the exchange of the liquid immersion member 70 (S16). Here, the state that "the pollution state of the liquid immersion member 70 is within the allowable range" means a state that the desired exposure and measurement accuracies can be maintained by using the liquid immersion member 70. The allowable range regarding the pollution state can be obtained in advance by, for example, an experiment or simulation, and can be stored in the controller 3.

On the other hand, when the controller 3 judges that the pollution state of the liquid immersion member 70 is outside the allowable range, based on the stored information and the result of the image-processing, then the controller 3 starts the exchange operation of the liquid immersion member 70 (S18). The controller 3 starts the exchange operation of the liquid immersion member 70 after recovering all the liquid on the substrate stage 2.

Figure 8:
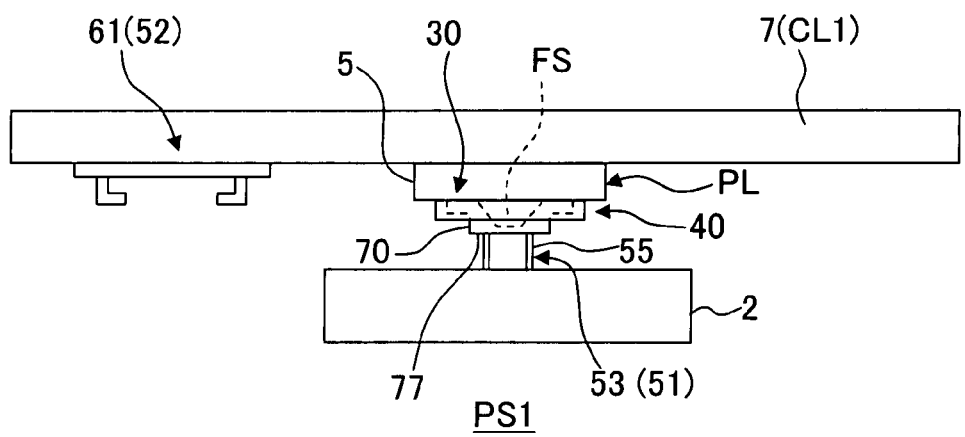
FIG. 8 is a schematic view for explaining the operation of the exchange system according to the first embodiment.

As shown in FIG. 8, the controller 3 adjusts the position of the substrate stage 2 such that the moving mechanism 53 of the substrate stage 2 is opposite to the lower surface of the liquid immersion member 70, and the controller 3 moves the pin-shaped members 55 of the moving mechanism 53 upwardly to make the upper surfaces of the pin-shaped members 55 contact with the land surface 77 of the liquid immersion member 70. Next, the controller 3 pulls out the support members 43 of the support mechanism 40 from the recesses 74M of the liquid immersion member 70 respectively, and afterwards the controller 3 releases the liquid immersion member 70 from being held by the holding device 30. Namely, the controller 3 provides the state shown in FIG. 5. With this, the liquid immersion member 70 is delivered (handed) at the first position PS1 from the holding device 30 to the moving mechanism 53 of the first sub-transport system 51.

Figure 9:
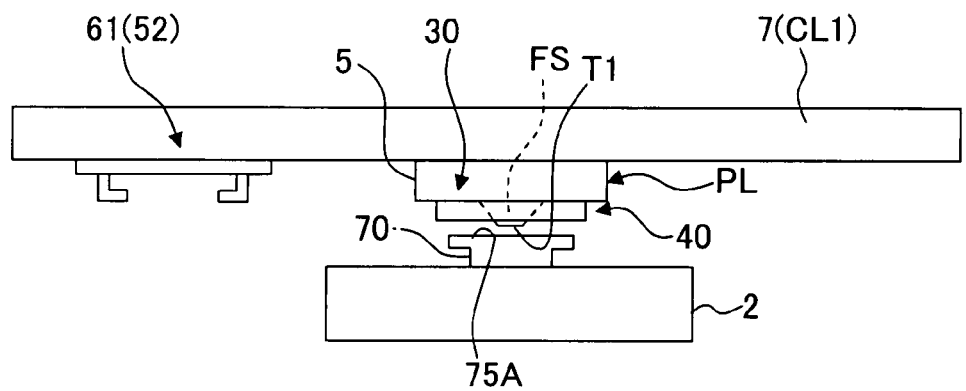
FIG. 9 is a schematic view for explaining the operation of the exchange system according to the first embodiment.

Next, the controller 3 moves the pin-shaped members 55 of the moving mechanism 53 downwardly in a state that the liquid immersion member 70 is supported by the pin-shaped members 55. With this, as shown in FIG. 9, the upper surface 75A of the liquid immersion member 70 is separated from the holding surface 31 of the holding device 30. In addition, the controller 3 moves the pin-shaped members 55 further downwardly until the upper surface 75A of the liquid immersion member 70 is located at a position lower than (on the −Z side of) the lower surface T1 of the final optical element FS. When the upper surface 75A of the liquid immersion member 70 cannot be located at the position lower than the lower surface T1 of the final optical element FS only by moving the pin-shaped members 55 downwardly, then the controller 3 can control the anti-vibration devices 10 supporting the substrate-stage surface plate 8 to thereby move downwardly the substrate-stage surface plate 8 together with the substrate stage 2. The anti-vibration devices 10 are each an active anti-vibration device provided with an actuator and a damper mechanism, and the actuators of the anti-vibration devices 10 are capable of moving the substrate-stage surface plate 8 at least in the Z-axis direction. Accordingly, the controller 3 drives the actuators of the anti-vibration devices 10 to move the substrate-stage surface plate 8 in the −Z direction, thereby making it possible to move the substrate stage 2 in the −Z direction (moves the substrate stage 2 downwardly). Therefore, the controller 3 drives the actuators of the anti-vibration devices 10, to thereby make it possible to move, in the −Z direction, also the liquid immersion member 70 supported on the pin-shaped members 55 of the moving mechanism 53 provided on the substrate stage 2, thus arranging the upper surface 75A of the liquid immersion member 70 at the position lower than the lower surface T1 of the final optical element FS. Of course, if possible, it is also allowable to move the barrel-surface plate 7 in the +Z direction, or it is allowable to move both the barrel-surface plate 7 and the substrate-stage surface plate 8, so that the upper surface 75A of the liquid immersion member 70 is located at the position lower than (on the −Z side of) the lower surface T1 of the final optical element FS. Further, it is also allowable to provide, as at least a part of the transport device 50, a movable member (for example, a transport arm) which is movable in the XY plane and capable of holding the liquid immersion member 70, and to move the movable member in the Z-axis direction with the liquid immersion member 70 held to the movable member in a state that the substrate stage 2 is retracted or withdrawn from the position just below the projection optical system PL. With this, the movement amount of the liquid immersion member 70 in the Z-axis direction can be made greater than the distance between the holding surface 31 of the holding device 30 and the lower surface T1 of the final optical element FS, thereby making it possible to arrange the upper surface 75A of the liquid immersion member 70 at the position lower than (on the −Z side of) the lower surface T1 of the final optical element FS.

Next, the controller 3 moves the substrate stage 2 at least in the Y-axis direction to move the substrate stage 2 to a position in the vicinity of the third position PS3 at which the first transport mechanism 61 of the second sub-transport system 52 is arranged. By the movement of the substrate stage 2 to the position in the vicinity of the third position PS3, the liquid immersion member 70 supported by the moving mechanism 53 in the substrate stage 2 also moves to the third position PS3 together with the substrate stage 2. As described above, since the upper surface 75A of the liquid immersion member 70 is located lower than the lower surface T1 of the final optical element FS, the liquid immersion member 70 on the substrate stage 2 does not make contact with the final optical element FS even when the substrate stage 2 is moved in the XY plane for moving the substrate stage 2 to the position in the vicinity of the third position PS3.

Figure 10:
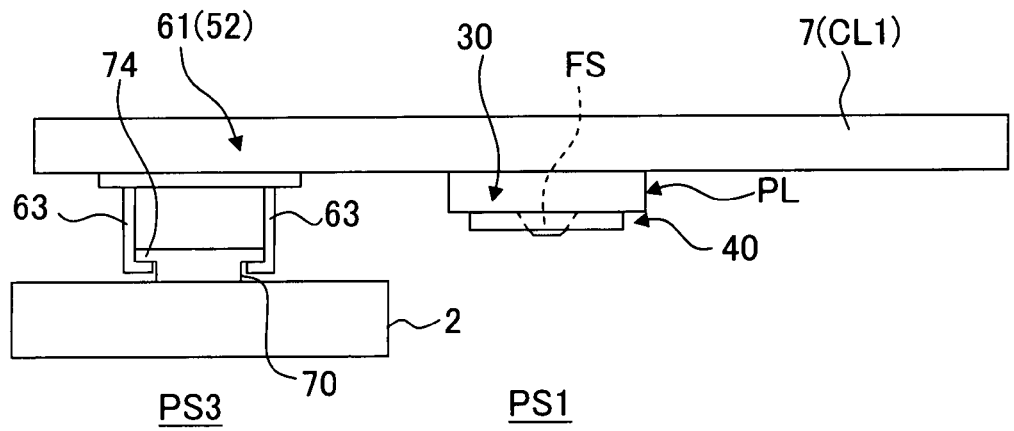
FIG. 10 is a schematic view for explaining the operation of the exchange system according to the first embodiment.

Then, as shown in FIG. 10, the controller 3 moves in the Z-axis direction at least one of the first arms 63 of the first transport mechanism 61 and the pin-shaped members 55 of the moving mechanism 53 so that the first arms 63 and the liquid immersion member 70 on the substrate stage 2, which is arranged at the position in the vicinity of the third position PS3, are moved close to each other. Next, the controller 3 relatively moves the first arms 63 of the first transport mechanism 61 and the moving mechanism 53 (substrate stage 2) at least in the X-axis direction so as to locate the supporting surfaces of the first arms 63 at positions below or under the flange 74 of the liquid immersion member 70. Afterwards, the controller 3 relatively moves the first arms 63 and the pin-shaped members 55 in the Z-axis direction so that the first arms 63 and the pin-shaped members 55 are separated and away from each other, and the controller 3 supports the flange 74 of the liquid immersion member 70 by the first arms 63 of the first transport mechanism 61. Thus, the liquid immersion member 70 is delivered (handed) at the third position PS3 from the moving mechanism 53 (pin-shaped members 55) of the first sub-transport system 51 to the first transport mechanism 61 (first transport arms 63) of the second sub-transport system 52.

Figure 11:
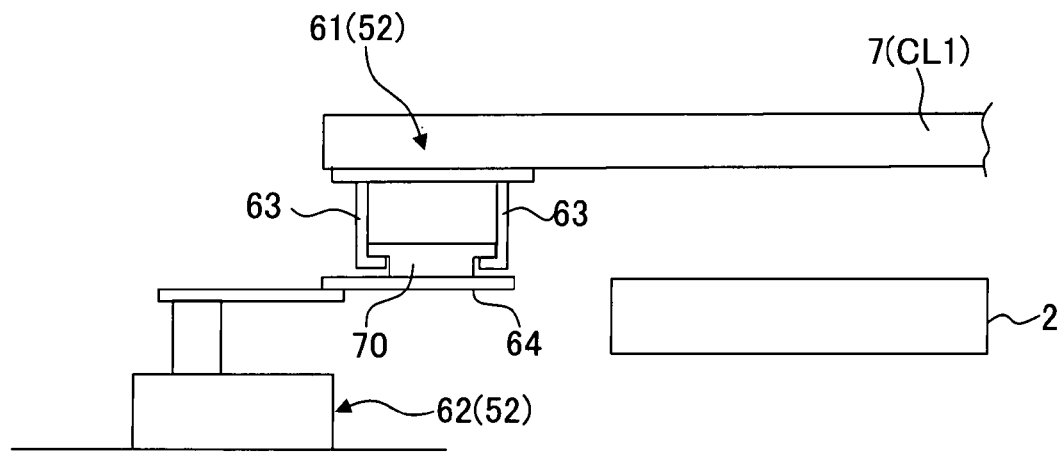
FIG. 11 is a schematic view for explaining the operation of the exchange system according to the first embodiment.

Next, as shown in FIG. 11, the controller 3 delivers the liquid immersion member 70 held, at the upper side thereof, by the first arms 63 of the first transport mechanism 61 to the second arm 64 of the second transport mechanism 62. The second arm 64 of the second transport mechanism 62 receives the liquid immersion member 70 at the position below or under thereof. Namely, the controller 3 extends the second arm 64 of the second transport mechanism 62 to the −Z side of the first transport mechanism 61, then relatively moves the second arm 64 in the Z-axis direction such that the first and second arms 63 and 64 approach toward each other, and the controller 3 delivers the liquid immersion member 70 from the first arms 63 of the first transport mechanism 61 to the second arm 64 of the second transport mechanism 62. The second arm 64 holds the liquid immersion member 70 such that the second arm 64 makes contact only with the land surface 77 of the liquid immersion member 70.

Figure 12:
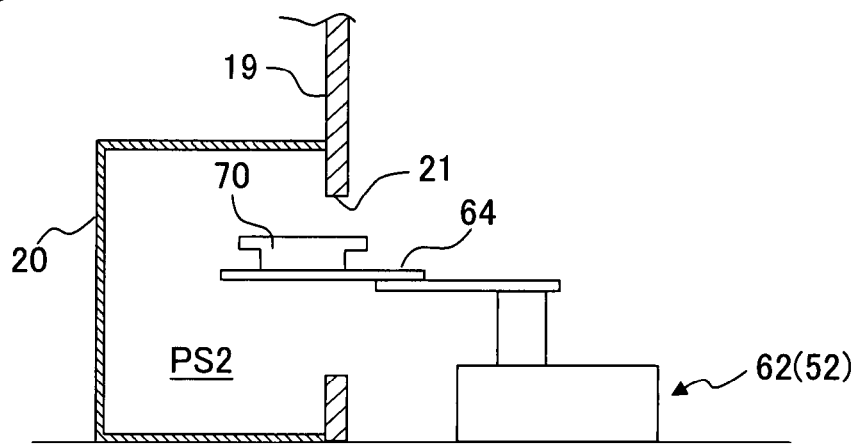
FIG. 12 is a schematic view for explaining the operation of the exchange system according to the first embodiment.

Next, as shown in FIG. 12, the controller 3 accommodates the liquid immersion member 70 to the accommodating station 20 located at the second position PS2 by using the second transport mechanism 62. Namely, the controller 3 moves the second arm 64 at least in the Y-axis direction and delivers the liquid immersion member 70 in the accommodating station 20 (the second position PS2). It should be noted that the controller 3 opens the door 22 to open the opening 21 upon accommodating the liquid immersion member 70 in the accommodating station 20 by using the second transport mechanism 62.

Figure 13:
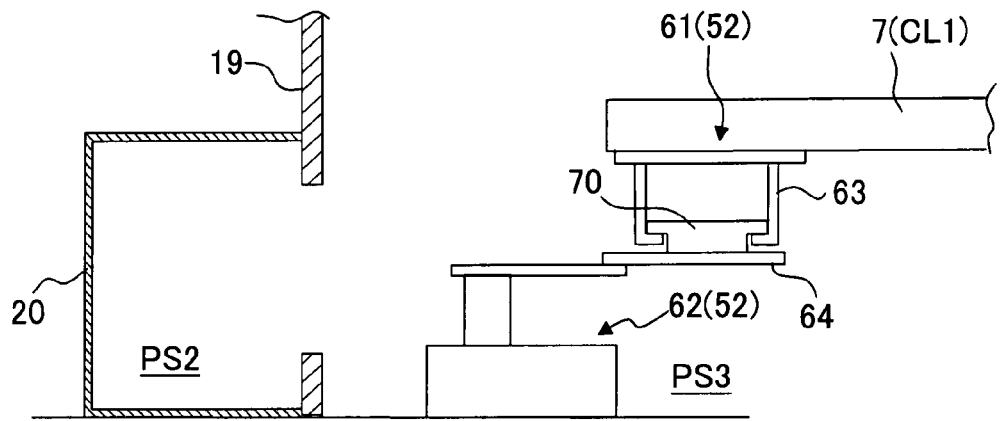
FIG. 13 is a schematic view for explaining the operation of the exchange system according to the first embodiment.

Next, the controller 3 performs an operation for attaching a new, clean liquid immersion member 70. The operation for attaching the new liquid immersion member 70 can be performed by operating the respective transport mechanisms by an order approximately reverse to that for the operation for detaching the liquid immersion member 70. Therefore, the explanation for the attaching operation is simplified. The controller 3 uses the second transport mechanism 62 of the second sub-transport system 52 to unload the new, clean liquid immersion member 70 accommodated in the accommodating station 20 therefrom. As shown in FIG. 13, the controller 3 delivers the new liquid immersion member 70 from the second transport mechanism 62 (second arm 64) to the first transport mechanism 61 (first arms 63).

Figure 14:
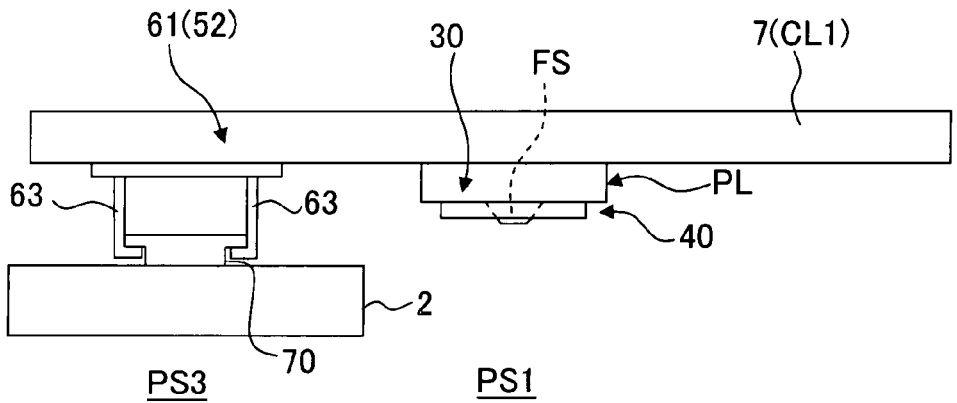
FIG. 14 is a schematic view for explaining the operation of the exchange system according to the first embodiment.

Next, as shown in FIG. 14, the controller 3 moves the substrate stage 2 to the position in the vicinity of the third position PS3 and delivers, at the third position PS3, the new liquid immersion member 70 from the first transport mechanism 61 (the first arm 64) to the moving mechanism 53 (pin-shaped members 55) provided on the substrate stage 2. In such a manner, the liquid immersion member 70 is delivered at the third position PS3 from the first transport mechanism 61 of the second sub-transport system 52 to the moving mechanism 53 of the first sub-transport system 51. FIG. 14 shows a state that the pin-shaped members 55 are lowered on the substrate stage 2.

Figure 15:
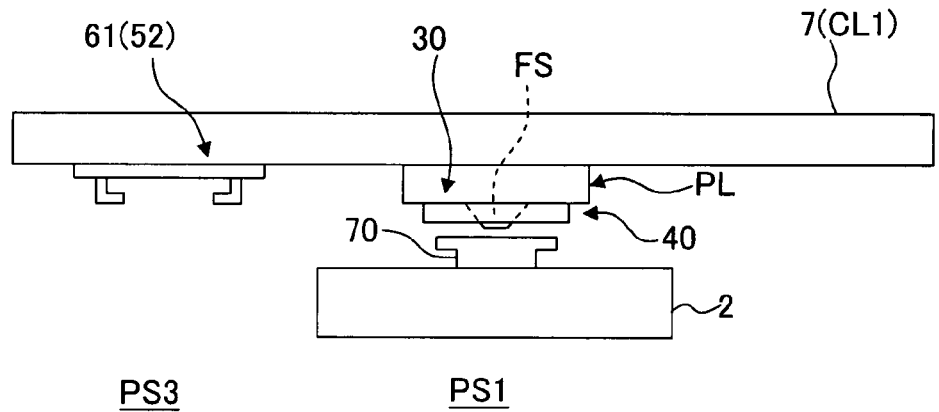
FIG. 15 is a schematic view for explaining the operation of the exchange system according to the first embodiment.

Afterwards, as shown in FIG. 15, the controller 3 moves the substrate stage 2 at least in the Y-axis direction to arrange the liquid immersion member 70 on the substrate stage 2 at a position below or under the holding device 30 (projection optical system PL). Upon moving the substrate stage 2 to arrange the liquid immersion member 70 below the holding device 30, the controller 3 can relatively move, in advance, the barrel-surface plate 7 and the substrate stage-surface plate 8 (namely, the projection optical system PL and the substrate stage 2) in the Z-axis direction so as to prevent the final optical element FS and the liquid immersion member 70 on the substrate stage 2 from making contact with each other.

Figure 16:
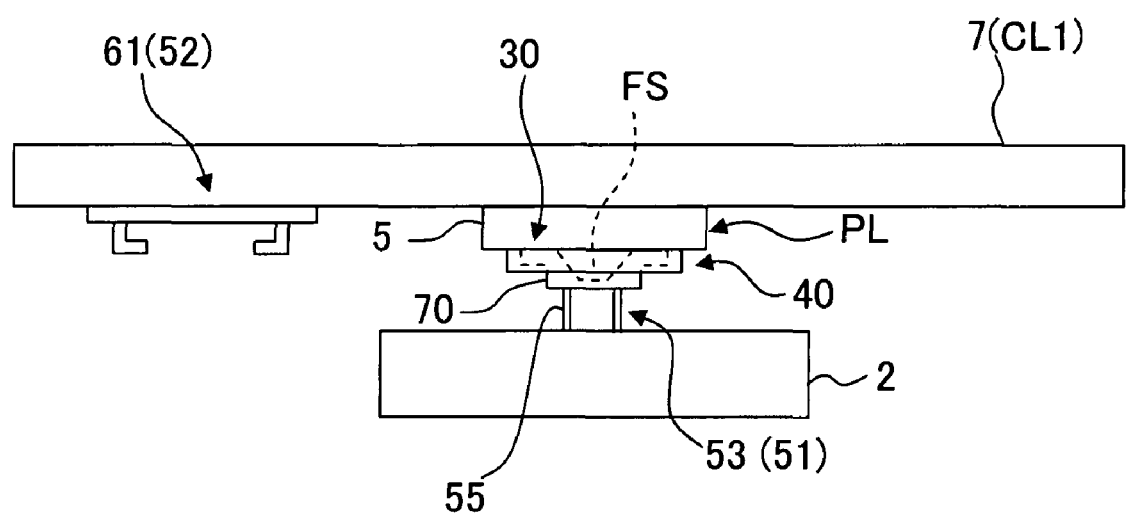
FIG. 16 is a schematic view for explaining the operation of the exchange system according to the first embodiment.

After arranging the liquid immersion member 70 on the substrate stage 2 at the position below the holding device 30, the controller 3 relatively moves the barrel-surface plate 7 and the substrate stage-surface plate 8 in the Z-axis direction and controls the moving mechanism 53 of the first sub-transport system 51 to move the liquid immersion member 70, supported by the pin-shaped members 55, upwardly up to the first position PS1 such that the holding device 30 and the liquid immersion member 70 supported by the moving mechanism 53 are close to each other. With this, as shown in FIG. 16, the liquid immersion member 70 supported by the pin-shaped members 55 approaches toward the holding device 30, and thus the upper surface 75 of the liquid immersion member 70 makes contact with the holding surface 31 of the holding device 30.

Figure 17:
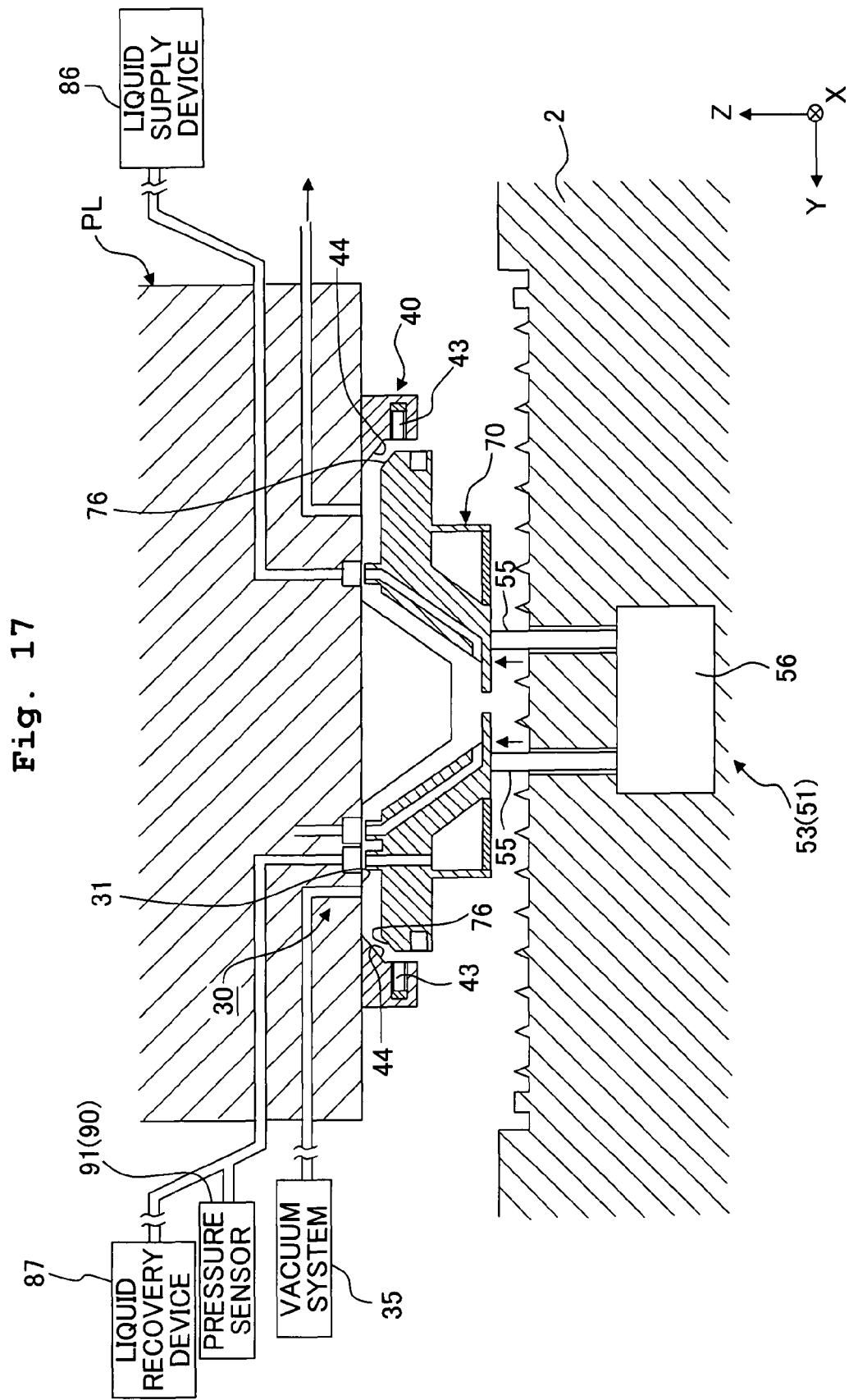
FIG. 17 is a schematic view for explaining the operation of the exchange system according to the first embodiment.

FIG. 17 shows a state in which the liquid immersion member 70 supported by the pin-shaped members 55 is made to approach toward the holding surface 31 of the holding device 30. The controller 3 moves the pin-shaped members 55 upwardly to thereby make it possible to move the liquid immersion member 70 supported by the pin-shaped members 55 toward the holding device 30 while guiding the liquid immersion member 70 with the inclined surfaces 44 formed in the base member 40. The new liquid immersion member 70 also have the inclined surfaces 76 formed therein, and the controller 3 can make the upper surface 75A of the liquid immersion member 70 approach toward the holding surface 31 of the holding device 30 while making the inclined surfaces 44 of the base member 41 to have a contact with the inclined surfaces 76 of the liquid immersion member 70. Accordingly, the controller 3 is capable of guiding the movement of the liquid immersion member 70 in the +Z direction with the inclined surfaces 44 of the base member 41, thereby adjusting the positional relationship between the holding device 30 and the liquid immersion member 70 held by the holding device 30.

Then, the controller 3 makes the liquid immersion member 70 to be attracted by the suction force at the first position PS1 by using the attraction mechanism 32 of the holding device 30 in a state that the upper surface 75A of the liquid immersion member 70 is made to have a contact with the holding surface 31 of the holding device 30. Thus, at the first position PS1, the liquid immersion member 70 is delivered to the holding device 30 by the moving mechanism 53 of the first subtransport mechanism 51 and is held by the holding device 30. Here, when a pressure sensor which detects the pressure in the first flow passage 34 is provided, the controller 3 can judge whether or not the attraction mechanism 32 of the holding device 30 can satisfactorily hold the liquid immersion member 70, based on the result of detection by the pressure sensor.

Further, when the liquid immersion member 70 is held by the holding device 30, the second flow passage 84 and the supply flow passages 81 are connected by the first connection mechanism 101 and the third flow passage 85 and the recovery flow passage 82 are connected by the second connection mechanism 102.

In addition, the controller 3 can move the liquid immersion member 70 held by the pin-shaped members 55 toward the holding device 30, and makes the support members 43 of the support mechanism 40 to be inserted to the recesses 74M of the liquid immersion member 70 respectively. Since the positional relationship between the holding device 30 and the liquid immersion member 70 is adjusted by the inclined surfaces 76 and 44, the support mechanism 40 can smoothly insert the support members 43 to the recesses 74M of the liquid immersion member 70. With this, the controller 3 can support the liquid immersion member 70 with the support mechanism 40 when the liquid immersion member 70 is not supported by the holding device 30.

After holding the liquid immersion member 70 by the holding device 30, the controller 3 moves the pin-shaped members 55 of the moving mechanism 53 in the −Z direction so as to separate the pin-shaped members 55 away from the liquid immersion member 70, and accommodates the pin-shaped members 55 in the substrate stage 2. Before the pin-shaped members 55 are moved in the −Z direction, the support members 43 of the support mechanism 40 are inserted in the recesses 74M of the liquid immersion member 70. Therefore, even if the liquid immersion member 70 is detached from the holding device 30 by any reason, it is possible to support the liquid immersion member 70 by the support members 43 of the supporting mechanism 40, thereby preventing the liquid immersion member 70 from falling.

Next, the controller 3 performs the liquid supply operation by the liquid supply device 86 and the liquid recovery operation by the liquid recovery device 87 in parallel for a predetermined period of time in a state that the liquid immersion member 70 and the upper surface 2F of the substrate stage 2 are opposite to or facing each other. Namely, while forming the liquid immersion area LR on the upper surface 2F of the substrate stage 2, the controller 3 makes the liquid LQ flow continuously through the second flow passage 84, the supply flow passages 81, the recovery flow passage 82 and the third flow passage 85 for the predetermined period of time, thereby cleaning (flushing), with the liquid LQ, the respective flow passages which make contact with the liquid LQ. In addition, by continuously making the liquid LQ flow, it is possible to clean (flush), with the liquid LQ, surfaces which make contact with the liquid LQ (liquid-contacting surfaces) such as the land surface 77 and the upper surface 79 of the liquid immersion member 70, and the like (S20). Moreover, this makes it possible to enhance the lyophilicity (hydrophilicity) of the liquid-contacting surfaces (the land surface 77, the lower surface 89 of the porous member 88, and the like) of the liquid immersion member 70. It is also allowable that, during the flushing operation, a dummy substrate is placed on the substrate holder 2H instead of the substrate P, and that the flushing is performed in a state that the liquid immersion member 70 is opposite to or facing the dummy substrate.

Then, after performing the flushing, the controller 3 loads a substrate P to be exposed next on the substrate stage 2, then resumes the liquid immersion exposure for the substrate P by using the new liquid immersion member 70 (S16).

As described above, since the exchange system CS which exchanges the liquid immersion member 70 is provided, it is possible to smoothly perform the exchange of the liquid immersion member 70 by using the exchange system CS. Accordingly, it is possible to suppress the lowering of the operation rate of the exposure apparatus EX, as well as to suppress the degradation in the exposure and measurement accuracies which would be otherwise caused due to the continued use of a liquid immersion member 70 in abnormal state.

Namely, for example, when the operator makes access to the liquid immersion member 70, in which any inconvenience or problem occurs, in order to exchange or perform the maintenance of the liquid immersion member 70, there is a possibility that the operation of the exposure apparatus EX is required to be stopped or interrupted. Further, there is a possibility that for smoothly performing the exchanging operation for the liquid immersion member 70 or the like, it is necessary to perform an exchanging operation and/or dismantling operation for a member and/or instrument attached in the periphery of the liquid immersion member 70. Furthermore, there is a possibility that the environment in the air-conditioned area (inside the chamber 19) vary due to the interruption of the exposure apparatus or the access by the operator to the liquid immersion member 70. Moreover, there is a possibility that after the completion of the exchange operation for the liquid immersion member 70, it is necessary to perform any returning operation for returning the detached or dismantled peripheral member and/or instrument to the state before the detachment or dismantling, and to perform any operation for setting a waiting time for returning the environment in the air-conditioned area back to the original state, so that the operation of the exposure apparatus EX can be resumed. Furthermore, there is a possibility that the interruption of the operation of the exposure apparatus EX makes it necessary that any calibration operation be performed for the respective devices and/or instruments constructing the exposure apparatus EX. In this case, there is a possibility that the operation rate of the exposure apparatus EX is greatly lowered.

In the embodiment, since the exchange system CS is provided, it is possible to omit the above-described detaching operation, dismantling operation and returning operation and the above-described calibration operation or the operation for setting the waiting time, thereby making it possible to smoothly exchange the liquid immersion member 70 without lowering the operation rate of the exposure apparatus EX. In the embodiment, since there is a possibility that the vibration is transmitted to the projection optical system PL via the liquid immersion member 70, it is allowable to suppress the transmission of the vibration by using, for example, an anti-vibration device or the like.

Second Embodiment

Next, the second embodiment will be explained with reference to FIG. 18. In the following description, the constitutive parts or components, which are the same as or equivalent to those of the first embodiment described above, are designated by the same reference numerals, any explanation of which will be simplified or omitted.

Figure 18:
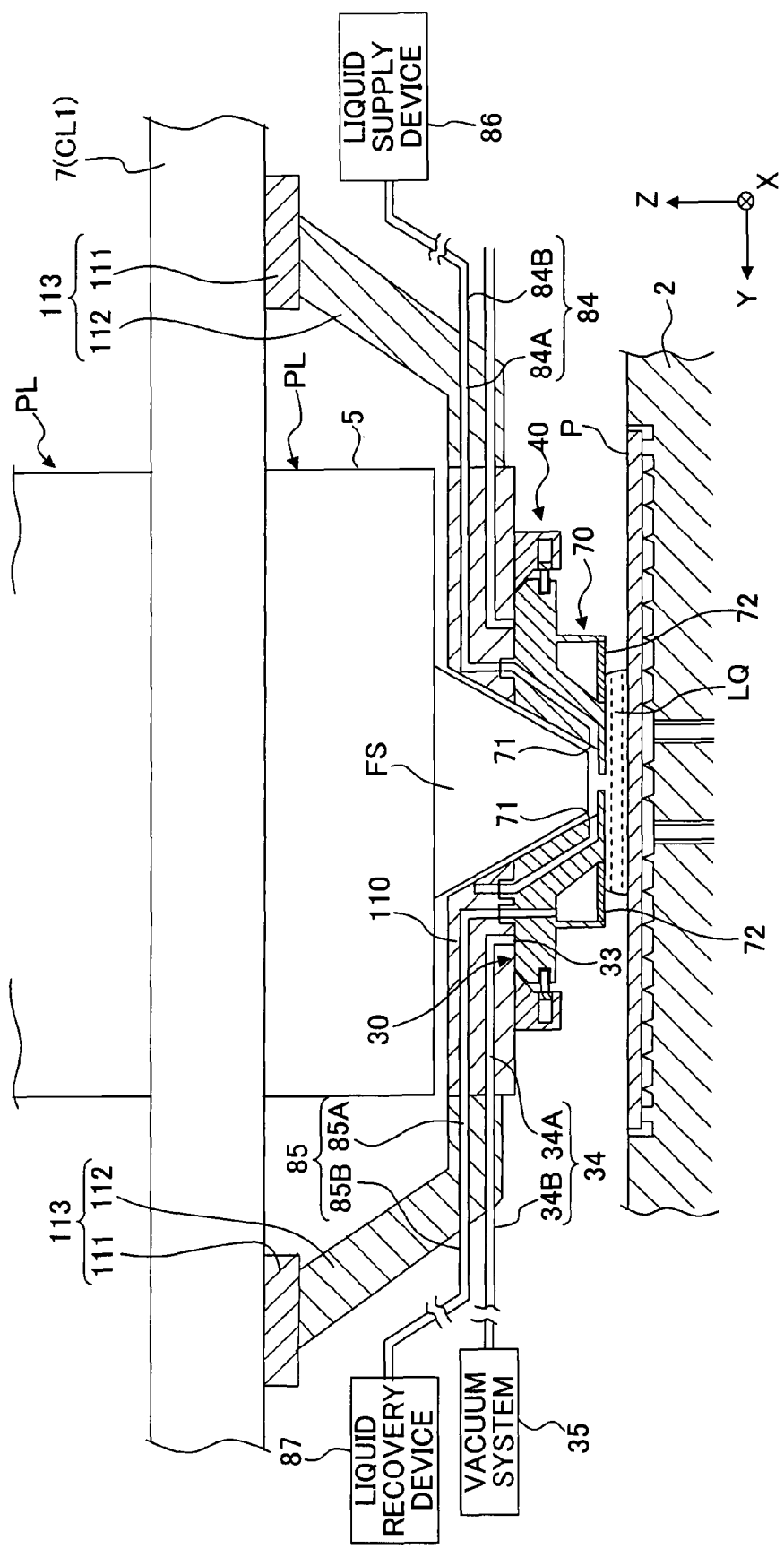
FIG. 18 shows is a sectional view showing main components of an exposure apparatus according to a second embodiment.

FIG. 18 is a sectional view showing the main components of the exposure apparatus EX according to the second embodiment. The feature of the second embodiment is that a holding surface 31 of a holding device 30 for holding a liquid immersion member 70 is provided on a support member 110 which is separate or distinct from a barrel 5. The support member 110 is an annular member arranged to surround a final optical element FS, and is provided with the holding surface 31 for holding the liquid immersion member 70 on the lower surface of the support member 110. A suction port 33 of an attraction mechanism 32 is provided on the holding surface 31 of the support member 110, in a same manner as in the above-described first embodiment.

The support member 110 is connected to a barrel-base plate 7 of a first column CL1 via a support mechanism 113. The support mechanism 113 includes anti-vibration devices 111, a connection member 112 connecting the anti-vibration devices 111 and the support member 110. Further, a first internal flow passage 34A of the first flow passage 34 is formed in the support member 110 and the connection member 112. Furthermore, a second internal flow passage 84A of the second flow passage 84 and a third internal flow passage 85A of a third flow passage 85 are also formed in the support member 110 and the connection member 112.

In such a manner, the member having the holding surface 31 for holding the liquid immersion member 70 can be set in any manner. As in the embodiment, the member having the holding surface 31 for holding the liquid immersion member 70 may be connected to the first column CL1 which includes the barrel-surface plate 7. Further, since the barrel-surface plate 7 of the first column CL1, the support member 110 and the connection member 112 are connected via the anti-vibration devices 111, it is possible to suppress the vibration, generated in the support member 110 and the connection member 112, from being transmitted to the projection optical system PL supported by the barrel-surface plate 7.

Furthermore, the holding surface 31 is not limited to be a surface parallel to the XY plane, and may be arranged to intersect the XY plane (for example, perpendicular to the XY plane). In the embodiment, although the support member 110 has an annular shape, the shape of the support member is not limited to this. For example, the support member 110 may be a plurality of support columns, or the like. In the above-described first and second embodiments, the member provided with the liquid immersion member 70 (barrel 5 or the support member 110) has the supporting surface 31. It is allowable, however, that the holding surface 31 is not provided on the member, depending on the construction of the holding mechanism of the liquid immersion member 70.

Third Embodiment

Figure 19:
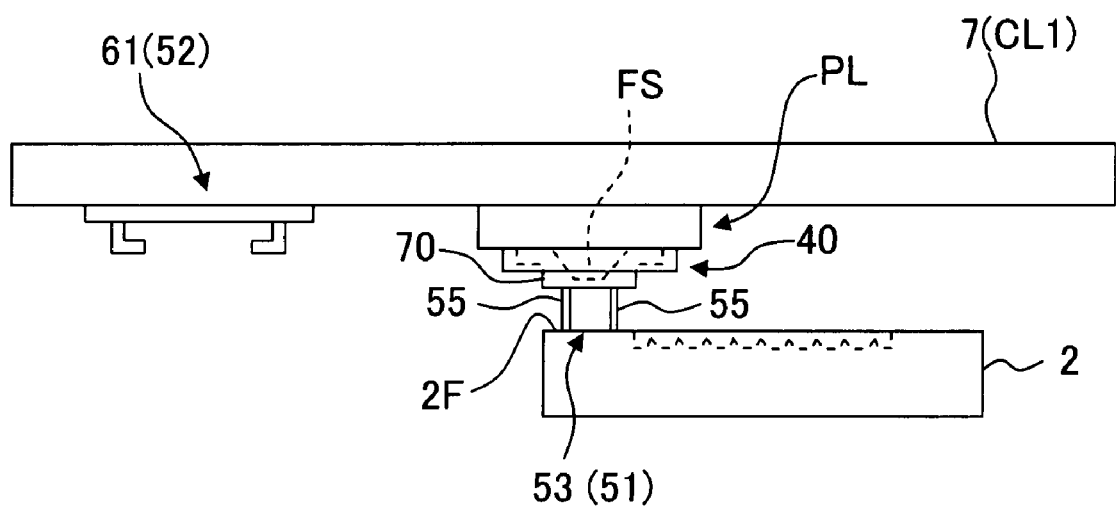
FIG. 19 is a schematic view showing a part of an exposure apparatus according to a third embodiment.

Next, the third embodiment will be explained with reference to FIG. 19. In the following description, the constitutive parts or components, which are the same as or equivalent to those of the embodiments described above, are designated by the same reference numerals, any explanation of which will be simplified or omitted. In the above-described embodiments, the pin-shaped members 55 of the moving mechanism 53 of the first sub-transport system 51 are arranged in the opening 54 of the substrate holder 2H and are capable of transporting (moving upwardly and downwardly) the substrate P also. In the third embodiment, on the other hand, the pin-shaped members 55 may be provided at a position different from the substrate holder 2H, as schematically shown in FIG. 19. In the example shown in FIG. 19, the pin-shaped members 55 are arranged on the upper surface 2F of the substrate stage 2. In the embodiment, the pin-shaped members which move the substrate P upwardly and downwardly and the pin-shaped members which move the liquid immersion member 70 upwardly and downwardly are provided separately. Therefore, it is possible to optimize the size, arrangement and/or the like of the pin-shaped members moving the liquid immersion member 70 upwardly and downwardly and of the pin-shaped members moving the substrate P upwardly and downwardly as appropriate, depending on the object to be transported by the members.

Fourth Embodiment

Figure 20:
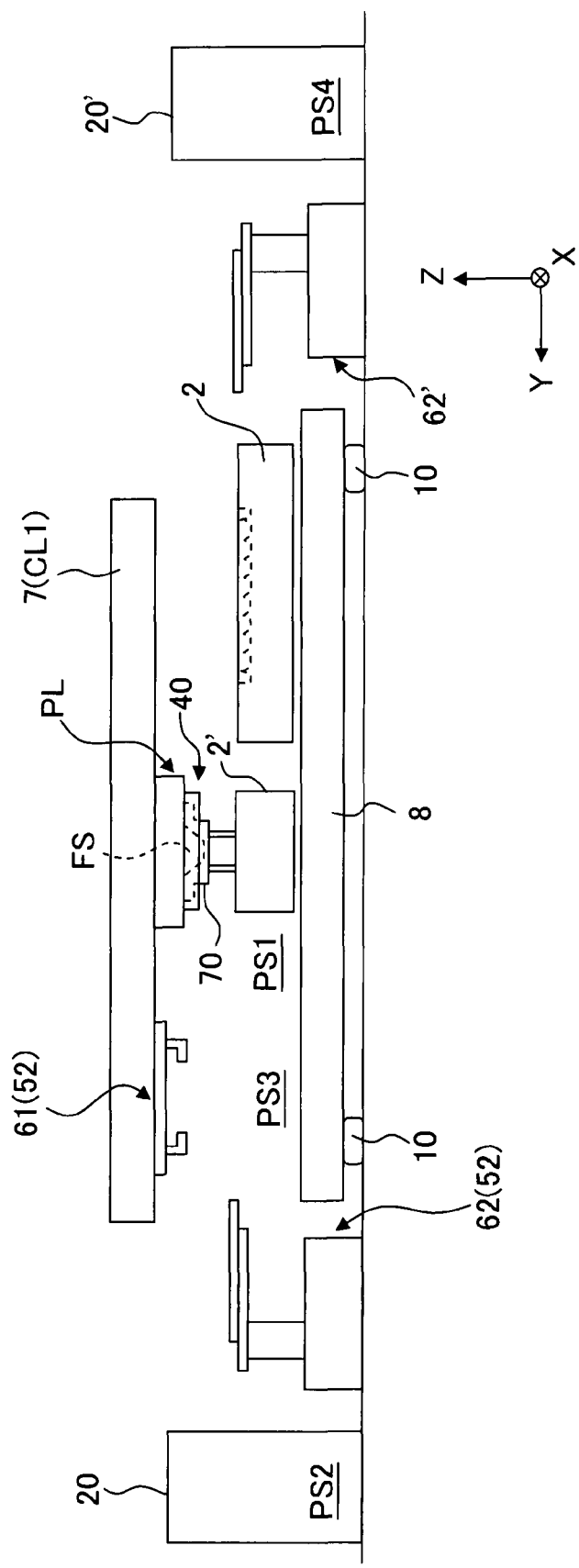
FIG. 20 is a schematic view showing a part of an exposure apparatus according to a fourth embodiment.

Next, the fourth embodiment will be explained with reference to FIG. 20. In the following description, the constitutive parts or components, which are the same as or equivalent to those of the embodiments described above, are designated by the same reference numerals, any explanation of which will be simplified or omitted. In the above-described embodiments, although the moving mechanism 53 of the first sub-transport system 51 is arranged in the substrate table 2, it is allowable that the moving mechanism 53 is not arranged in the substrate stage 2. For example, it is allowable, as shown in FIG. 20, that the moving mechanism 53 is arranged in a mover 2' which is different from the substrate stage 2. In the fourth embodiment, the mover 2' is movable between a position in the vicinity of the first position PS1 at which the holding device 30 is arranged and a position in the vicinity of the third position PS3 at which the first transport mechanism 61 is arranged.

Also in the embodiment, a transport device 50' which transports the substrate P is a different device from the transport device 50 which transports the liquid immersion member 70. In the embodiment, the transport device 50 which transports the liquid immersion member 70 includes the mover 2' and is capable of transporting the liquid immersion member 70 between the first position PS1 at which the holding device 30 is arranged and the second position PS2 at which the accommodating station 20 is arranged. On the other hand, the transport device 50' which transports the substrate P is capable of loading the substrate P to the substrate stage 2 at a fourth position PS4 at which the transport device 50' performs delivery and receipt of the substrate P to and from the substrate-accommodating station 20 or a peripheral device such as a coater/developer or the like. In the embodiment, although the substrate P is unloaded from the substrate stage 2 at the fourth position PS4, it is also allowable that the substrate P is unloaded at a position different from the fourth position PS4. Namely, the loading position and unloading position for the substrate P may be different. Alternatively, in an exposure apparatus EX provided with a measurement stage having a measuring member, the measurement stage may be used as the mover 2'.

Fifth Embodiment

Figure 21:
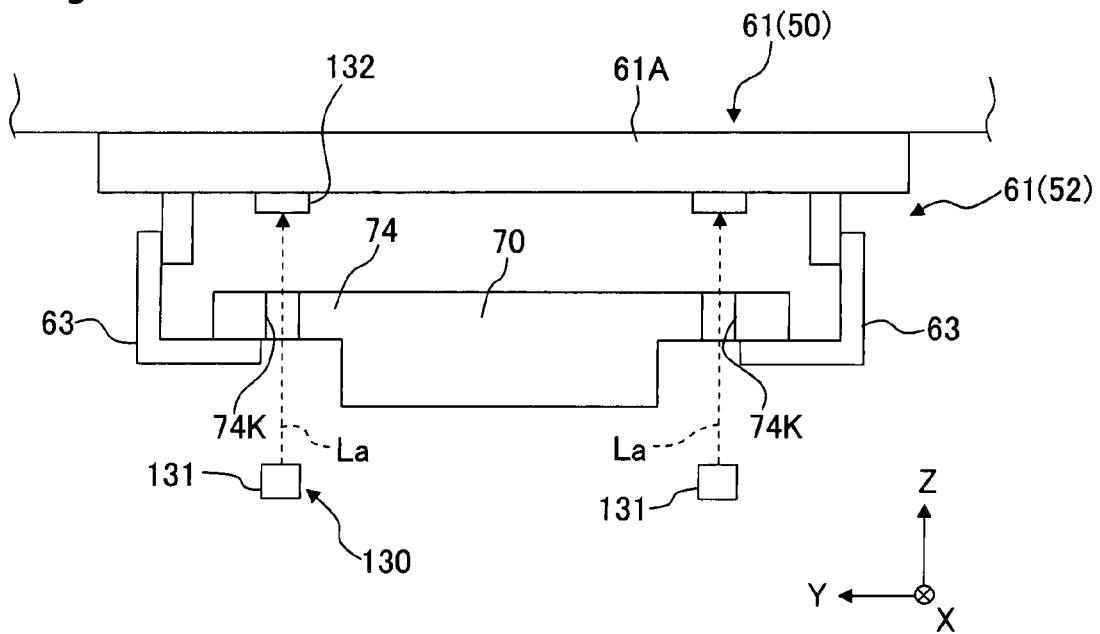
FIG. 21 is a schematic view showing a part of an exposure apparatus according to a fifth embodiment.
Figure 22:
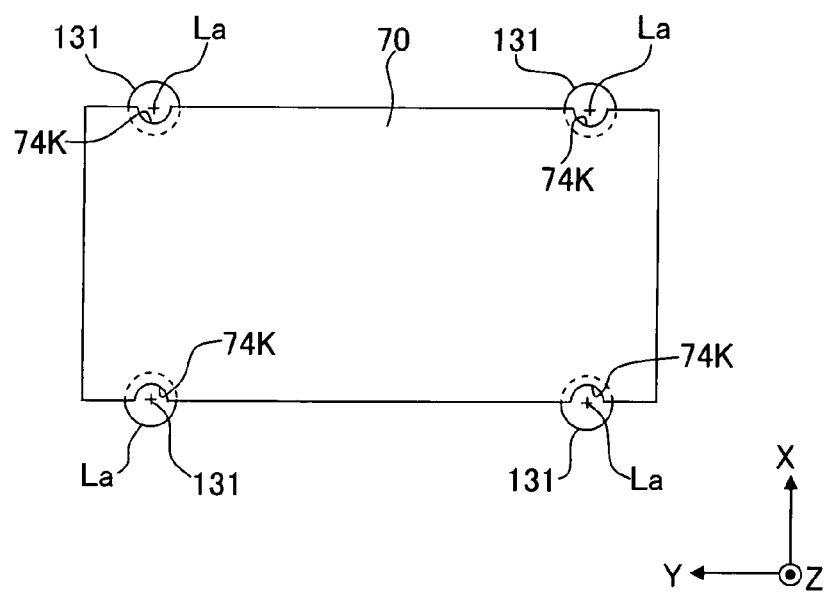
FIG. 22 is a schematic view showing a part of the exposure apparatus according to the fifth embodiment.

Next, the fifth embodiment will be explained with reference to FIGS. 21 and 22. In the above-described embodiments, the movement of the liquid immersion member 70 toward the holding device 30 is guided by the inclined surfaces 44 to thereby adjust the positional relationship between the liquid immersion member 70 and the holding device 30. The feature of the fifth embodiment, on the other hand, is that an optical device 130 is provided as a device (alignment device) which adjusts the positional relationship between the liquid immersion member 70 and the holding device 30. The optical device 130 is provided on the transport path for the transport device 50, includes a light-projector (light-emitter) 131 which emits a detection light La and a light-receiver 132 which is capable of receiving the detection light La, and optically obtains the position information about the liquid immersion member 70 held by the transport device 50. In the following description, the constitutive parts or components, which are the same as or equivalent to those of the embodiments described above, are designated by the same reference numerals, any explanation of which will be simplified or omitted.

In the fifth embodiment, the optical device 130 is arranged on the transport path for the first transport mechanism 61. As shown in FIG. 21, the optical device 130 is provided with a plurality of pieces of the light-projector 131 arranged in a predetermined positional relationship with respect to the first arms 63 of the first transport mechanism 61, and a plurality of pieces of the light-receiver 132 arranged in a predetermined positional relationship with respect to the light-projectors 131 respectively. In the embodiment, each of the light-receivers 132 is disposed on the lower surface of an upper-plate member 61A of the first transport mechanism 61, and each of the light-projectors 131 is arranged to opposite to or facing one of the light-receivers 132.

Each of the light-projectors 131 and each of the light-receivers 132 are arranged corresponding to one of the plurality of (four pieces of) cutouts 74K formed in the liquid immersion member 70. Each of the light-projectors 131 is capable of emitting the detection light La onto a position in the vicinity of one of the cutouts 74K formed at the edge portion of the liquid immersion member 70. The controller 3 makes the detection light La emitted from the light-projectors 131 while moving the first arms 63 holding the liquid immersion member 70 thereto in the directions of six degrees of freedom. The controller 3 moves the first arms 63 holding the liquid immersion member 70 thereto such that the detection light La, emitted from each of the light-projectors 131, is received in a predetermined state by one of the light-receivers 132 via one of the cutouts 74K. The position information about the first arms 63 at this time is detected by, for example, a position-detector such as an encoder or the like. The controller 3 stores the position information about the first arms 63 at a point of time when each of the detection light La is received by one of the light-receivers 132 in the predetermined state, and consequently, the position information about the liquid immersion member 70 at this point of time. The relationship between the position of the liquid immersion member 70 and the position of the holding device 30 at the point of time when each of the detection lights La is received by one of the light-receivers 132 in the predetermined state is already known; and the controller 3 transports the liquid immersion member 70 to the holding device 30 by using the first transport mechanism 61 and the moving mechanism 53 on the substrate stage 2, while monitoring the result of detection by the position detector, the result of measurement by the laser interferometer 15, and the like. With this, the controller 3 can transport the liquid immersion member 70 to the holding device 30 in the desired positional relationship with respect to the holding device 30. In such a manner, in the embodiment, the liquid immersion member 70 can be attached to the holding device 30 in the desired state, while making the liquid immersion member 70 have less contact with other members.

The optical device 130 can be arranged in any manner provided that the position and/or the rotation of the liquid immersion member 70 can be detected. Namely, the construction of the optical device 130 is not limited to the above-described construction.

In each of the first to fifth embodiments, the controller 3 detects the state of the liquid immersion member 70 by using the imaging device 92; and the controller 3 judges, based on the detection result, whether or not the exchange of the liquid immersion member 70 is required. It is allowable, however, that the controller 3 judges whether or not the exchange of the liquid immersion member 70 is required, based on the result of detection by the pressure sensor 91. In this case, the imaging device 92 may be omitted, or the imaging device 92 and the pressure sensor 91 may be used together in order to make judgment about the necessity for exchanging the liquid immersion member 70.

Further, it is also allowable to provide, on the liquid supply device 86 and/or the liquid recovery device 87, a sensor (for example, a particle counter or the like) which checks (detects) the state of the liquid LQ so as to judge whether or not the exchange of the liquid immersion member 70 is required based on the state of the liquid LQ detected by the sensor. Although in each of the above-described first to fifth embodiments, the detector 90 includes at least one of the pressure sensor 91, the imaging device 92 and the particle counter, the kind and/or number of the sensor(s) included in the detector 90 is not limited to this.

Further, when the liquid immersion member 70 is in unsatisfactory (abnormal) state such that the lower surface (land surface 77 and/or the like) of the liquid immersion member 70 is polluted or the like, then there is a possibility that the liquid immersion area LR cannot be maintained in a desired shape. Accordingly, it is allowable that the judgment about the necessity of exchanging the liquid immersion member 70 is made based on the shape of the liquid immersion area LR. In this case, for example, the operator may judge whether or not the exchange of the liquid immersion member 70 is required by making a visual observation or by observing an image taken by the imaging device 92.

Furthermore, when the liquid immersion member 70 is in an abnormal state such that the lower surface (land surface 77 and/or the like) of the liquid immersion member 70 is polluted or the like, then there is a possibility that the droplets of the liquid LQ remain on the substrate P and that the remaining liquid-droplets increase the occurrence of the defect in the pattern formed on the substrate. Accordingly, it is also allowable to judge whether or not the exchange of the liquid immersion member 70 is required based on the exposure result (defect) of the substrate P.

Moreover, for example, the imaging result by the imaging device 92 may be displayed on the display device of the output device 18. Since the operator can confirm the information displayed by the display device, the operator may judge the necessity of exchanging the liquid immersion member 70 based on the display result by the display device. When the exchange operation is performed for the liquid immersion member 70 based on the display result by the display device, an instruction signal for activating the exchange system CS can be inputted via the input device 17. The controller 3 can control the exchange operation of the liquid immersion member 70 based on the input signal inputted via the input device 17.

Further, in the above-described first to fifth embodiments, the state of the liquid immersion member 70 is detected by using the imaging device 92 every time predetermined pieces of the substrate are processed, or at a predetermined time interval. However, it is allowable, for example, that the operator inputs via the input device 17, at any timing, an instruction signal for performing the detection operation using the imaging device 92. Then, the operator or the controller 3 can judge whether or not the exchange of the liquid immersion member 70 is required based on the detection result (imaging results) of the imaging device 92.

It is also allowable that the imaging device 92, which judges the necessity of exchanging the liquid immersion member 70, or the like is omitted and that the operator inputs at a predetermined timing the instruction for exchanging the liquid immersion member 70 via the input device 17. Alternatively, the controller 3 may output the instruction for exchanging the liquid immersion member 70 at a predetermined timing. Namely, the liquid immersion member 70 may be exchanged, without performing the judgment about the necessity of exchanging the liquid immersion member 70 by the operator or the controller 3. In this case, it is allowable that only the detection result by the detector 90 or the like is not used, or that the detection operation for the judgment about the exchange necessity is not performed. This applies exactly same also to judgment whether or not cleaning (washing) the liquid immersion member 70 is required in a sixth embodiment which will be described later on.

In the first to fifth embodiments, although the liquid immersion member 70 is provided with both the supply and recovery ports 71, 72, it is allowable that a member having any one of the liquid supply port and the liquid recovery port is exchanged by the exchange system CS. Alternatively, it is also allowable to use the exchange system CS of the embodiments to exchange a seal member (liquid immersion member) as disclosed, for example, in Japanese Patent Application Laid-open No. 2004-289126 (corresponding to U.S. Pat. Nos. 6,952,253 and 7,075,616). Still alternatively, only a part of the liquid immersion member 70 may be exchanged by using the exchange system CS.

In the above-described first to fifth embodiments, the support mechanism 40 may be omitted, provided that it can be ensured that the liquid immersion member 70 is satisfactorily held by the holding device 30.

Also, in the first to fifth embodiments, the transport device 50 for transporting the liquid immersion member 70 is provided with the moving mechanism 53, the first transport mechanism 61, and the second transport mechanism 62. It is not necessarily indispensable, however, that the transport device 50 is provided with all of the above mechanisms; and the transport device 50 may have any construction provided that the transport device 50 is capable of transporting the liquid immersion member 70 between the first position PS1 at which the holding device 30 is arranged and the second position PS2 at which the accommodating station 20 is arranged. For example, in a case that the substrate stage 2 can be moved to a position in the vicinity of the second transport mechanism 62, it is possible to perform the delivery and receipt of the liquid immersion member 70 between the moving mechanism 53 (pin-shaped members 55) arranged in the substrate stage 2 and the second transport mechanism 62 (second arm 64). Accordingly, in such a case, the first transport mechanism 61 can be omitted. On the other hand, when the delivery and receipt of the liquid immersion member 70 can be performed between the second arm 64 and the holding device 30, then the moving mechanism 53 and the first transport mechanism 61 can be omitted.

In the first to fifth embodiments, the second position PS2 of the exchange system CS is defined outside the chamber 19. However, the position at which the second position PS2 is defined is not limited to this, and the second position PS may be defined inside the chamber 19, for example. It is allowable, for example, that the transport system 50 is constructed only of a mechanism which moves the liquid immersion member 70 away from the holding device 30 in the Z-axis direction or a mechanism which moves the liquid immersion member 70 closer to the holding device 30 in the Z-axis direction (for example, the above-described moving mechanism 53); and that the second position PS2 is defined at a position just below or under (on the −Z side of) the first position PS1. In this case, although it is necessary that the operator or the like makes access to the inside of the chamber 19, the time required for exchanging the liquid immersion member 70 can be reduced, thereby suppressing the lowering of operation rate of the exposure apparatus EX.

In the above-described first to fifth embodiments, the operation for exchanging the liquid immersion member 70 is performed by using the exchange system CS. However, it is not necessarily indispensable that the exchange system CS is used in the maintenance method for each of these embodiments; and it is allowable that the operator performs manually at least a part of the exchange operation.

Further, in the first to fifth embodiments, although another liquid immersion member is attached to the body of the exposure apparatus in the exchange of the liquid immersion member 70, it is allowable, for example, that the liquid immersion member 70 transported from the body of the exposure apparatus is cleaned in a space isolated from the body of the exposure apparatus (for example, in the accommodating station 20, at the outside of the exposure apparatus, or the like) and this cleaned liquid immersion member 70 is transported back and attached to the body of the exposure apparatus again. Namely, in each of the embodiments, it is allowable to judge whether or not the cleaning of the liquid immersion member 70 is required, rather than the exchange thereof is required, or it is allowable to both judge whether or not the cleaning of the liquid immersion member 70 is required and whether or not the exchange of the liquid immersion member 70 is required. In the following, this maintenance operation will be explained.

Sixth Embodiment

Figure 24:
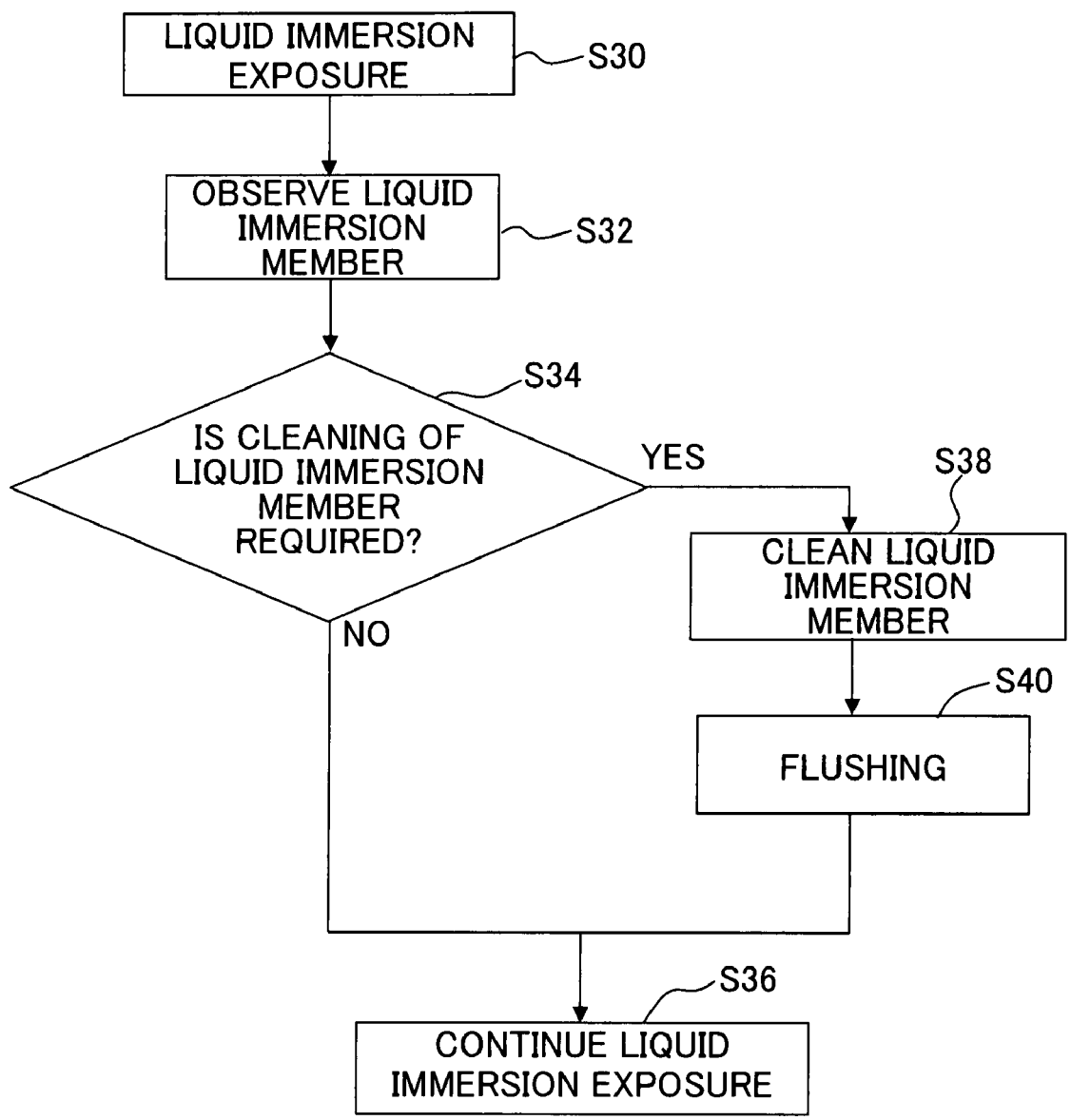
FIG. 24 is a flow chart showing an example of a maintenance and exposure method which includes cleaning operation for the liquid immersion member.

In the above-described first to fifth embodiments, the explanation was given about the maintenance operation in which the liquid immersion member 70 is exchanged with a clean liquid immersion member 70 by using the exchange system CS. With respect to the sixth embodiment, on the other hand, an explanation will be given about a maintenance operation in which the liquid immersion member 70 is cleaned to be reused, rather than exchanged. In the following explanation, only the difference between the sixth and first embodiments will be described with reference to FIGS. 1 and 24, and the constitutive parts or components, which are the same as or equivalent to those of the embodiment described above, are designated by the same reference numerals, any explanation of which will be omitted. First, similarly to the first embodiment, the liquid immersion area LR of the liquid LQ is locally formed on a part or portion of the substrate P by using the exposure apparatus EX explained in relation to FIG. 1; and the liquid immersion exposure is performed by irradiating the exposure light EL onto the substrate P while moving the substrate P in the Y-axis direction with respect to the optical path space K (S30). After the completion of the liquid immersion exposure, the controller 3 observes the state of the liquid immersion member 70. The observation of the liquid immersion member 70 may be performed by using the imaging device 92 as shown in FIG. 7 or may be visually performed by the operator (S32). In the former case, the controller 3 (or the operator) judges whether or not the cleaning of the liquid immersion member 70 is required, based on the detection result of the imaging device 92; and in the latter case, the operator judges whether or not the cleaning of the liquid immersion member 70 is required, based on the result of the visual observation (S34). For example, the controller 3 performs image-processing of information about the image imaged or photographed by the imaging device 92, and judges, based on the result of the image-processing, whether or not the cleaning of the liquid immersion member 70 is required.

As described above, the information about the allowable range regarding the pollution state of the liquid immersion member 70 is stored in advance in the controller 3. The controller 3 judges whether or not the cleaning of the liquid immersion member 70 is required, based on the stored information and on the result of image processing. For example, when the controller 3 judges, based on the stored information and on the result of image processing, that the pollution state of the liquid immersion member 70 is within the allowable range, the controller 3 continues the liquid immersion exposure operation using the liquid immersion member 70, without performing the cleaning of the liquid immersion member 70 (S36).

On the other hand, when it is judged based on the stored information and on the result of image processing that the pollution state of the liquid immersion member 70 is outside the allowable range, then the liquid immersion member 70 is transported to the outside of the chamber 19 by using the transport device 50 having the first sub-transport system 51 and the second sub-transport system 52, as described in the first embodiment. The cleaning of the transported liquid immersion member 70 can be performed in a cleaning station 200 which is arranged parallel to the accommodating station 20 in the X direction as shown in FIG. 1. The cleaning station 200 is provided with a cleaning device (not shown in the drawing) which cleans the liquid immersion member 70 transported by the transport device 50. The cleaning device includes, for example, a jetting nozzle which jets a cleaning liquid. The cleaning of the liquid immersion member 70 is performed in the cleaning station 200 by jetting the cleaning liquid and a rinsing liquid such as pure water (purified water) onto the liquid immersion member 70 (S38). The cleaning may be performed by immersing the liquid immersion member 70 in a vessel or tub filled with the cleaning liquid. After the cleaning, it is allowable to place the liquid immersion member 70 on a rotary stage or the like so as to shake off the cleaning liquid and the rinsing liquid by the rotation of the rotary stage. It is also allowable to use a blower and/or a heater to dry the liquid immersion member 70 instead of, or together with, the rotary stage. After the cleaning, the liquid immersion member 70 is returned to the inside of the chamber 19 by using the transport device 50 again, as explained in the first embodiment, and the liquid immersion member 70 is held by the holding device 30 after being handled by the second transport mechanism 62, the first transport mechanism 61 and the substrate stage 2 (moving mechanism 53).

The controller 3 continues to flow the liquid LQ through the second flow passage 84, the supply flow passages 81, the recovery flow passage 82 and the third flow passage 85 for a predetermined period of time to thereby performing, with the liquid LQ, the cleaning (flushing) for the respective flow passages which make contact with the liquid LQ, while forming the liquid immersion area LR on the upper surface 2F of the substrate stage 2 (S40). The flushing may be omitted. After the completion of the flushing, the controller 3 loads a substrate P, to be exposed next, on the substrate stage 2 and resumes or continues the liquid immersion exposure of the next substrate P by using the cleaned liquid immersion member 70 (S36).

As explained above, it is possible to transport the liquid immersion member 70 to the outside of the chamber 19 by using the transport device 50 and the holding device 30 of the exchange system CS, and to clean the liquid immersion member 70 by using the cleaning station 200. The cleaning operation makes it possible to suppress the lowering of the working rate of the exposure apparatus EX and to suppress the degradation of the exposure and measurement accuracies which would be otherwise caused due to the continuous use of the liquid immersion member 70 in an abnormal state.

In the embodiment, the moving mechanism 53 of the transport device 50 is used to attach and detach the liquid immersion member 70 to and from the holding device 30. It is allowable, however, that the operator manually performs the attaching-detaching operation of the liquid immersion member 70 without using the mechanism and device. Further, it is also allowable that the operator manually transports the liquid immersion member 70 to the outside of the chamber 19 without using the transport device 50. Namely, the maintenance method of this embodiment may be performed by the operator manually.

It is also possible to switchingly use, as appropriate, the exchange operation of the liquid immersion member 70 described in the first embodiment and the cleaning operation of the liquid immersion member 70 described in the sixth embodiment. For example, it is possible to perform the exchange operation of the liquid immersion member 70 only when the result of the detection of the state of the liquid immersion member 70 by the imaging device 92 indicates that the pollution (uncleanness) of the liquid immersion member 70 cannot be removed by the cleaning; and it is possible to perform the cleaning operation for the liquid immersion member 70 when the extent of the pollution is smaller than the above case but the extent of pollution requires the cleaning. With this, it is possible to suppress the lowering of the throughput (working rate) of the exposure apparatus, thereby making it possible to perform the maintenance operation finely and efficiently.

The projection optical system of the above-described first to sixth embodiments fills the optical path space on the side of the image plane (light-exit plane) of the end optical element (final optical element FS). However, it is also possible to adopt a projection optical system which fills, with a liquid, also an optical path space on the object side of the end optical element, as disclosed, for example, in International Publication No. 2004/019128 (corresponding to United States Patent Application Publication No. 2005/0248856). Further, when a liquid immersion member for filling the optical path space on the object side of the end optical element with the liquid is provided, it is allowable to use the exchange system CS to exchange this liquid immersion member.

In the first to sixth embodiments as described above, the projection optical system PL is supported by the barrel-surface plate 7. It is allowable, however, that the projection optical system PL is hung from and supported with respect to a main frame member (not shown in the drawing) arranged at a position over or above the projection optical system PL, or with respect to the mask-stage surface plate 6 or the like, as disclosed for example in International Publication No. 2006/038952. Further, in each of the above-described embodiments, the liquid immersion member 70 is provided in the support member 110 (namely, the barrel-surface plate 7) or the barrel 5. However, it is allowable, for example, that the liquid immersion member 70 is hung and supported together with the projection optical system PL; that the liquid immersion member 70 is provided in a measurement frame which is hung and supported independently from the projection optical system PL; or that the liquid immersion member 70 is provided on a pedestal stand provided independently from the first column CL1. Furthermore, in the respective embodiments, although a part of the exchange system CS is provided on the barrel-surface plate, it is allowable for example that at least a part of the exchange system CS is provided on the above-described measuring frame or the pedestal stand provided independently from the first column CL1.

The projection optical system PL is not limited to the reduction system, and may be any one of the ×1 magnification system and the magnifying system. Further, the projection optical system PL may be any one of the dioptric system including no catoptric optical element, the catoptric system including no dioptric optical element, and the catadioptric system including both the dioptric and catoptric optical elements. It is also allowable to use the so-called inline type catadioptric system in which a plurality of reflecting surfaces are provided; an optical system (catoptric or dioptric system) forming an intermediate image at least once is provided at a part thereof; and a single optical axis is provided, as disclosed, for example, in International Publication No. 2004/107011 (corresponding to United States Patent Application Publication No. 2006/0121364). Further, the projection optical system PL may form any one of inverted image and erecting image. Furthermore, although the illumination area IA and the exposure area AR are each an on-axis area which includes the optical axis in the field of vision of the projection optical system PL, each of the illumination area IA and the exposure area AR may be, for example, an off-axis area which does not include the optical axis, in the same manner as in the inline type catadioptric system. Moreover, the shape of the illumination area IA and the exposure area AR is not limited to the rectangular shape, and may have any other shape, for example, such as circular arc-shaped form, trapezoidal form, or parallelogram form.

As described above, the liquid LQ in the embodiments is pure or purified water. Pure water is advantageous in that pure water is available in a large amount with ease, for example, in a semiconductor production factory, and that pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash (clean) the surface of the substrate P and the surface of the optical element provided at the end surface of the projection optical system PL.

It is approved that the refractive index n of pure water (water) with respect to the exposure light EL having a wavelength of about 193 nm is approximately 1.44. When the ArF excimer laser beam (wavelength: 193 nm) is used as the light source of the exposure light EL, then the wavelength is shortened on the substrate P by 1/n, i.e., to about 134 nm, and a high resolution is obtained. Further, the depth of focus is magnified about n times, i.e., about 1.44 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In each of the above-described embodiments, the final optical element FS is attached to the end portion of the projection optical system PL, and it is possible to adjust, with this optical element, the optical characteristics of the projection optical system PL, for example, the aberration (spherical aberration, coma aberration and the like). The final optical element FS of the projection optical system PL may be an optical plate which is used to adjust the optical characteristics of the projection optical system PL, or a plane-parallel through which the exposure light EL is transmissive.

When the pressure, which is generated by the flow of the liquid LQ, is large between the substrate P and the optical element at the end portion of the projection optical system PL, it is also allowable that the optical element is tightly fixed so that the optical element is not moved by the pressure, instead of making the optical element to be exchangeable.

In the embodiments of the present invention, the space between the projection optical system PL and the surface of the substrate P is filled with the liquid LQ. However, it is also allowable for example that the space is filled with the liquid LQ in such a state that a cover glass constructed of a plane-parallel is attached to the surface of the substrate P.

The liquid LQ is water (pure or purified water) in each of the embodiments of the present invention. However, the liquid LQ may be any liquid other than water. For example, when the light source of the exposure light EL is the $F_2$ laser beam, the $F_2$ laser beam is not transmitted through water. Therefore, the liquid LQ may be, for example, a fluorine-based fluid such as fluorine-based oil and perfluoropolyether (PFPE). In this case, a portion, which makes contact with the liquid LQ, is subjected to a liquid-attracting treatment by forming, for example, a thin film with a substance, including fluorine, which has a molecular structure with small polarity. Alternatively, other than the above, it is also possible to use, as the liquid LQ, liquids (for example, cedar oil) which have the transmittance with respect to the exposure light EL, which have the refractive index as high as possible, and which are stable against the photoresist coated on the surface of the substrate P and the projection optical system PL.

The liquid LQ, which has the refractive index (for example, not less than 1.5) higher than that of pure water, includes, for example, predetermined liquids having the C—H bond or the O—H bond such as isopropanol having a refractive index of about 1.50 and glycerol (glycerin) having a refractive index of about 1.61, predetermined liquids (organic solvents) such as hexane, heptane, and decane, and decalin (decahydronaphthalene) having a refractive index of about 1.60. As for the liquid LQ, it is also allowable to use liquids obtained by mixing any two or more liquids of the foregoing liquids and liquids obtained by adding (mixing) at least one of the foregoing liquid or liquids to (with) pure water. Further, as for the liquid LQ, it is also allowable to use liquids obtained by adding (mixing) base or acid such as $H^+$, $Cs^+$, $K^+$, $Cl^-$, $SO_4^{2-}$, and $PO_4^{2-}$ to (with) pure water, and it is also allowable to use liquids obtained by adding (mixing) fine particles of Al oxide or the like to (with) pure water. As for the liquid LQ, it is preferable to use liquids which have the small coefficients of light absorption, which have the small temperature dependency, and which are stable against the photosensitive material (or, for example, the top coat film or the antireflection film) coated on the surface of the substrate P and/or the projection optical system PL. As for the liquid LQ, it is also allowable to use liquids having a refractive index with respect to the exposure light EL higher than that of the water, such as liquids having refractive indexes of about 1.6 to 1.8. As for the liquid LQ, it is also possible to use supercritical fluids.

The final optical element FS of the projection optical system PL may be formed, for example, of silica glass or single crystal materials of fluoride such as calcium fluoride, barium fluoride, strontium fluoride, lithium fluoride, and sodium fluoride. Alternatively, the final optical element FS may be formed of a material having a refractive index (for example, not less than 1.6) higher than those of silica glass and calcium fluoride. Those usable as the material having the refractive index of not less than 1.6 include, for example, sapphire and germanium dioxide as disclosed, for example, in International Publication No. 2005/059617, and potassium chloride (refractive index: about 1.75) as disclosed in International Publication No. 2005/059618. In a case that another optical element, of the projection optical system PL, which is different from the final optical element FS makes contact with the liquid LQ, the another optical element may also be formed of a same material as that of the final optical element FS. For example, as disclosed in United States Patent Application Publication No. 2005/0248856, when the optical path space on the object side of the final optical element FS of the projection optical system is also filled with the liquid LQ, an optical element on the object side of the final optical element FS may also be formed of the silica glass, calcium fluoride or a material having a refractive index of not less than 1.6. Further, it is allowable that a thin film which is lyophilic and/or which has anti-elution function is formed on an optical element making a contact with the liquid LQ, for example, on a part or entirety of a surface of the final optical element FS (including at least a contact surface with the liquid LQ). Although the silica glass has a high affinity with the liquid LQ and does not require any anti-elution film, it is desired that calcium fluoride has at least anti-elution film formed thereon. Further, it is allowable that a light-shielding film is formed on the final optical element FS at an area different from the area through which the exposure light EL passes, to thereby suppress the degradation of an optical part (for example, the seal member) due to the exposure light EL.

Further, it is allowable to make a refractive index $n_1$ of the final optical element FS with respect to the exposure light EL to be smaller than a refractive index $n_2$ of the liquid LQ with respect to the exposure light EL. For example, the final optical element FS is formed of silica glass (refractive index: about 1.5), and a liquid having the refractive index $n_2$ (for example, refractive index of about 1.6 to 1.8) higher than that of the silica glass is used as the liquid LQ. Alternatively, in the projection optical system PL, the refractive index $n_1$ of the final optical element FS may be greater than the refractive index $n_2$ of the liquid LQ. For example, the final optical element FS is made of a material having the refractive index of not less than 1.6; and a liquid, having the refractive index $n_2$ which is greater than that of the pure or purified water and smaller than that of the final optical element FS, is used as the liquid LQ. In this case, it is desired that the refractive index $n_2$ of the liquid LQ, which is smaller than the refractive index $n_1$ of the final optical element FS, is greater than the numerical aperture NA of the projection optical system PL.

In each of the above-described embodiments, although the position information of each of the mask stage 1 and the substrate stage 2 is measured by using the interferometer system, the measurement is not limited to this. For example, an encoder system, which detects a scale (diffraction grating) provided on each of the stages, may be used. In this case, it is preferable that a hybrid system including both of the interferometer system and the encoder system is provided, and that the measurement result of the interferometer system is used to calibrate the measurement result of the encoder system. The stage position control may be performed by switchingly using the interferometer system and the encoder system or using both of the interferometer and encoder systems.

In the respective embodiments described above, although the excimer laser is used as the light source emitting the exposure light EL, it is allowable to use a mercury lamp, a high harmonic wave-generating device such as a semiconductor laser, or the like. As the light source emitting the ArF ecximer laser beam as the exposure light EL, it is allowable to use a high harmonic wave-generating device which includes, for example, a solid laser light source such as a DFB semiconductor laser or a fiber laser, a light-amplifying section having a fiber amplifier or the like, and a wavelength-converting section, and which outputs a pulse light having a wavelength of 193 nm as disclosed, for example, in International Publication No. 1999/46835 (corresponding to U.S. Pat. No. 7,023,610).

Further, in each of the above-described embodiments, the construction of the liquid immersion system such as the liquid immersion member is not limited to those described above. It is allowable to use a liquid immersion system disclosed, for example, in International Publication No. 2004/086468 (corresponding to United States Patent Application Publication No. 2005/0280791), International Publication No. 2005/024517, European Patent Publication No. 1420298, International Publication No. 2004/055803, International Publication No. 2004/057589, International Publication No. 2004/057590, International Publication No. 2005/029559 (corresponding to United States Patent Application Publication No. 2006/0231206), U.S. Pat. No. 6,952,253, and the like.

The substrate P, which is usable in the respective embodiments described above, is not limited to the semiconductor wafer for producing the semiconductor device. Substrates applicable include, for example, a glass substrate for the display device, a ceramic wafer for the thin film magnetic head, a master plate (synthetic silica glass, silicon wafer) for the mask or the reticle to be used for the exposure apparatus, or a film member. The shape of the substrate P is not limited to the circular shape. It is also allowable to use other shapes such as a rectangular shape.

The exposure apparatus EX of the present invention is applicable, in addition to the step-and-scan scanning type exposure apparatus (scanning stepper) in which the pattern of the mask M is subjected to the scanning exposure by synchronously moving the substrate P and the mask M, to a projection exposure apparatus (stepper) based on the step-and-repeat system for performing the full field exposure with the pattern of the mask M in a state in which the mask M and the substrate P are allowed to stand still, while successively step-moving the substrate P. In this case, a projection optical system, such as the dioptric type projection optical system having a reduction magnification of ⅛ and including no catoptric element is used as the projection optical system, for example.

Furthermore, in the exposure based on the step-and-repeat system, it is also allowable that after a full field exposure is performed to transfer a reduction image of the first pattern on the substrate P by using a projection optical system in a state in which the first pattern and the substrate P are allowed to substantially stand still; then, the full field exposure is further performed thereafter on the substrate P by partially overlaying a reduction image of a second pattern with the first pattern by using the projection optical system in a state in which the second pattern and the substrate P are allowed to substantially stand still (exposure apparatus which performs full field exposure based on the stitch system). As for the exposure apparatus based on the stitch system, the present invention is also applicable to the exposure apparatus based on the step-and-stitch system in which at least two patterns are partially overlaid and transferred on the substrate P, and the substrate P is successively moved.

The exposure apparatus EX of each of the above-described embodiments of the present invention may also be a multi-stage type (twin-stage type) exposure apparatus which is provided with a plurality of substrate stages as disclosed, for example, in Japanese Patent Application Laid-open Nos. 10-163099 and 10-214783 (corresponding to U.S. Pat. Nos. 6,341,007, 6,400,441, 6,549,269, and 6,590,634), Published Japanese Translation of PCT International Publication for Patent Application No. 2000-505958 (corresponding to U.S. Pat. No. 5,969,441). In this case, the moving mechanism 53 may be arranged in each of the substrate stages to be used for exchanging the liquid immersion member, or the moving mechanism 53 may be arranged only in a predetermined substrate stage among the substrate stages to be used for exchanging the liquid immersion member. The contents of the above-mentioned United States Patents are incorporated herein by reference within a range of permission of the domestic laws and ordinances of the designated or selected state.

Further, the exposure apparatus of each of the embodiments may also be an exposure apparatus including a substrate stage for holding the substrate and a measuring stage provided with the measuring member (for example, reference member formed with a reference mark and/or various types of photoelectric sensors) as disclosed, for example, in Japanese Patent Application Laid-open No. 11-135400 (corresponding to International Publication No. 1999/23692) and Japanese Patent Application Laid-open No. 2000-164504 (corresponding to U.S. Pat. No. 6,897,963). For example, the mover 2' explained with reference to FIG. 20 may be the measuring stage.

Furthermore, the exposure apparatus of the respective embodiments may be an exposure apparatus provided with a plurality of substrate stages and measuring stages.

Although each of the embodiments as described above adopts the exposure apparatus which locally fills the liquid between the projection optical system PL and the substrate P, the present invention is also applicable to a liquid immersion exposure apparatus which performs the exposure in a state in which the entire surface of the substrate as the exposure objective is immersed in the liquid as disclosed, for example, in Japanese Patent Application Laid-open Nos. 6-124873 and 10-303114 and U.S. Pat. No. 5,825,043.

In the respective embodiments described above, the explanation is given about the exposure apparatus provided with the projection system PL by way of example. However, the present invention is also applicable to an exposure apparatus and an exposure method in which the projection optical system PL is not used. Even if the projection optical system PL is not used, the exposure light is irradiated onto the substrate via an optical member such as a lens, and the liquid immersion area is formed in a predetermined space between the optical member such as lens and the substrate.

The type of the exposure apparatus EX is not limited to the exposure apparatus, for producing the semiconductor element, which exposes the substrate P with the semiconductor element pattern. The present invention is also widely applicable, for example, to the exposure apparatus for producing the liquid crystal display device or producing the display as well as to the exposure apparatus for producing, for example, the thin film magnetic head, the micromachine, MEMS, DNA chip, the image pickup element (CCD), the reticle, or the mask.

In each of the embodiments, the light-transmissive type mask in which a predetermined light-shielding pattern (or phase pattern, light-dimming pattern) is formed on a light-transmissive base member. However, it is also allowable to use, instead of this mask, an electronic mask (which is also called as "variably shaped mask" and includes, for example, DMD (Digital Micro-mirror Device) that is one kind of the no light-emitting image display device or spatial light modulator), the electronic mask forming a transmissive pattern, a reflective pattern or light-emitting pattern on the basis of electronic data of a pattern to be exposed, as disclosed in U.S. Pat. No. 6,778,257 for example.

The exposure apparatus of each of the embodiments may be an exposure apparatus which exposes a line-and-space pattern on the substrate P by forming an interference pattern on the substrate P, as disclosed in International Publication No. 2001/035168, for example. Furthermore, the exposure apparatus of the respective embodiments may be an exposure apparatus in which two mask patterns are coupled or combined on the substrate via a projection optical system and one shot area on the substrate is almost simultaneously double-exposed by one time of scanning exposure as disclosed, for example, in Published Japanese Translation of PCT International Publication for Patent Application No. 2004-519850 (corresponding to U.S. Pat. No. 6,611,316).

As described above, the exposure apparatus EX according to the embodiments is produced by assembling the various subsystems including the respective constitutive elements as defined in claims so that the predetermined mechanical accuracy, electric accuracy and optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which the temperature, the cleanness and the like are managed.

Figure 25:
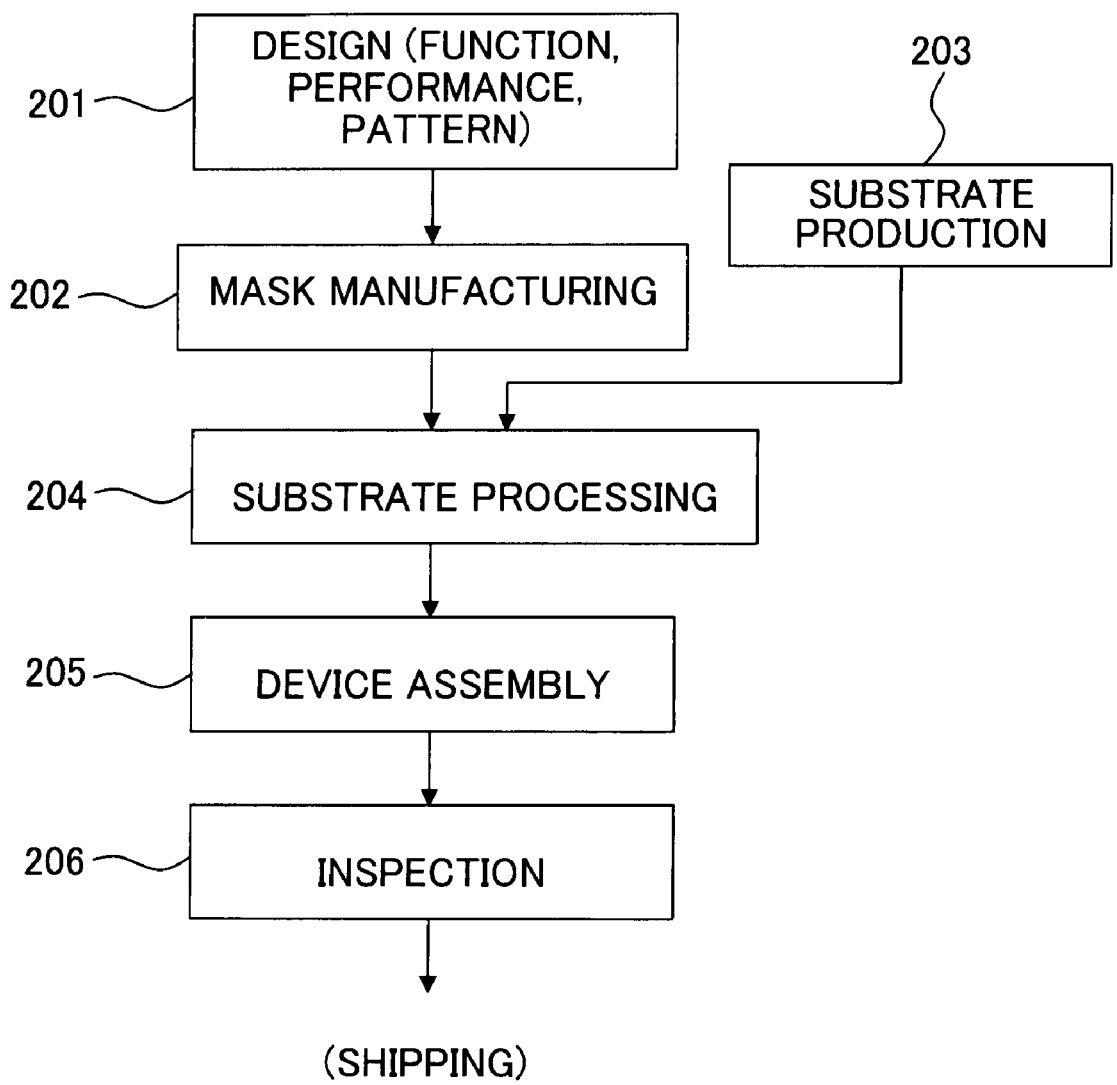
FIG. 25 is a flow chart illustrating exemplary steps for producing a microdevice.

As shown in FIG. 25, the microdevice such as the semiconductor device is produced by performing, for example, a step 201 of designing the function and the performance of the microdevice, a step 202 of producing a mask (reticle) based on the designing step, a step 203 of producing a substrate as a base material for the device, a substrate-processing step 204 including an exposure step of exposing the substrate with a pattern of the mask by using the exposure apparatus EX of the embodiments described above and a development step of developing the exposed substrate, a step 205 of assembling the device (including processing processes such as a dicing step, a bonding step, and a packaging step), and an inspection step 206. The maintenance method, including the exchange and/or the cleaning of the liquid immersion member as described in the embodiments, is included in the substrate-processing step 204.

According to the present invention, it is possible to suppress the lowering in the device productivity by performing the maintenance of the liquid immersion member. In particular, any inconvenience due to the pollution of the liquid immersion member can be prevented in advance, thereby manufacturing the device having a highly integrated circuit pattern with high throughput. Therefore, the present invention will greatly contribute to the development of the information-technology and the high-tech industry including the semiconductor industry in our country.

What is claimed is:

1. A maintenance method for an exposure apparatus which exposes a substrate with an exposure light beam through a liquid, the method comprising:
    judging a state of a liquid immersion member based on an exposure defect of the exposed substrate;
    detaching the liquid immersion member, based on a result of the judgement, from the exposure apparatus having an optical member via which the exposure light exits, the liquid immersion member being different from the optical member, the exposure apparatus exposing the substrate through a liquid, which is retained between the optical member and the substrate by the liquid immersion member, while moving the substrate relative to the optical member and the liquid immersion member; and
    cleaning the detached liquid immersion member or exchanging the detached liquid immersion member with another liquid immersion member.

2. The maintenance method according to claim 1, further comprising detaching the liquid immersion member from the exposure apparatus at a predetermined time interval or every time after the exposure is performed for predetermined pieces of the substrate.

3. The maintenance method according to claim 1, comprising detecting a state of the liquid immersion member; and detaching the liquid immersion member from the exposure apparatus based on a result of the detection.

4. The maintenance method according to claim 1, wherein the exposure apparatus has a holding device which detachably holds the liquid immersion member; and the liquid immersion member is detached from the exposure apparatus by releasing the liquid immersion member from the holding device.

5. The maintenance method according to claim 1, wherein the detached liquid immersion member is transported to a predetermined position in the exposure apparatus or to a position outside the exposure apparatus.

6. The maintenance method according to claim 1, further comprising attaching the liquid immersion member which has been cleaned to the exposure apparatus, or attaching the another liquid immersion member, with which the detached liquid immersion member has been exchanged, to the exposure apparatus.

7. The maintenance method according to claim 1, wherein when the liquid immersion member is loaded and unloaded for the cleaning or the exchange, the liquid immersion member is moved relative to the optical member in a direction perpendicular to a plane in which the substrate is moved.

8. An exposure method comprising:
    performing maintenance of an exposure apparatus having a liquid immersion member with the maintenance method as defined in claim 1; and
    exposing a substrate through a liquid.

9. A method for producing a device, comprising:
    exposing a substrate by the exposure method as defined in claim 8;
    developing the exposed substrate; and
    processing the developed substrate.

10. The maintenance method according to claim 1, wherein the liquid immersion member has at least one of a supply port supplying the liquid and a recovery port recovering the liquid.

11. The maintenance method according to claim 10, wherein a porous member is arranged in the recovery port.

12. The maintenance method according to claim 3, wherein the detection of the state of the liquid immersion member includes imaging a surface of the liquid immersion member.

13. The maintenance method according to claim 5, wherein the transporting of the liquid immersion member is performed by using a transporting system of the exposure apparatus.

14. The maintenance method according to claim 13, wherein the transporting system includes a substrate stage which is movable while holding the substrate thereto.

15. The maintenance method according to claim 1, wherein the detaching of the liquid immersion member includes adjusting a positional relationship between the liquid immersion member and the optical member to prevent the liquid immersion member from making contact with the optical member.

16. The maintenance method according to claim 15, wherein the detaching of the liquid immersion member includes moving the liquid immersion member along a guide portion.

17. The maintenance method according to claim 15, wherein the detaching of the liquid immersion member includes obtaining a position information about the liquid immersion member.

18. The maintenance method according to claim 6, wherein the attaching of the liquid immersion member includes adjusting a positional relationship between the liquid immersion member and the optical member to prevent the liquid immersion member from making contact with the optical member.

19. The maintenance method according to claim 18, wherein the attaching of the liquid immersion member includes moving the liquid immersion member along a guide portion.

20. The maintenance method according to claim 18, wherein the attaching of the liquid immersion member includes obtaining a position information about the liquid immersion member.

21. The maintenance method according to claim 6, further comprising cleaning the attached liquid immersion member.

22. The maintenance method according to claim 21, wherein the attached liquid immersion member is cleaned by bringing the attached liquid immersion member into contact with the liquid.

23. The maintenance method according to claim 21, wherein the attached liquid immersion member is cleaned by supplying the liquid between the attached liquid immersion member and a dummy substrate which is different from the substrate.

24. A maintenance method for an exposure apparatus which exposes a substrate with an exposure light beam through a liquid, the method comprising:
  judging a state of a liquid immersion member based on a state of the liquid recovered via the liquid immersion member; and
  detaching the liquid immersion member, based on a result of the judgment, from the exposure apparatus having an optical member via which the exposure light exits, the liquid immersion member being different from the optical member, the exposure apparatus exposing the substrate through a liquid, which is retained between the optical member and the substrate by the liquid immersion member, while moving the substrate relative to the optical member and the liquid immersion member; and
  cleaning the detached liquid immersion member or exchanging the detached liquid immersion member with another liquid immersion member.

25. The maintenance method according to claim 24, wherein the liquid immersion member has at least one of a supply port supplying the liquid and a recovery port recovering the liquid.

26. The maintenance method according to claim 25, wherein a porous member is arranged in the recovery port.

27. The maintenance method according to claim 24, further comprising attaching the liquid immersion member which has been cleaned to the exposure apparatus, or attaching the another liquid immersion member, with which the detached liquid immersion member has been exchanged, to the exposure apparatus, and
  cleaning the attached liquid immersion member.

28. The maintenance method according to claim 27, wherein the attached liquid immersion member is cleaned by bringing the attached liquid immersion member into contact with the liquid.

29. The maintenance method according to claim 28, wherein the attached liquid immersion member is cleaned by supplying the liquid between the attached liquid immersion member and a dummy substrate which is different from the substrate.

30. An exposure method comprising:
  performing maintenance of an exposure apparatus having a liquid immersion member with the maintenance method as defined in claim 24; and
  exposing a substrate through a liquid.

31. A method for producing a device, comprising:
  exposing a substrate by the exposure method as defined in claim 30;
  developing the exposed substrate; and
  processing the developed substrate.

32. A maintenance method for an exposure apparatus which exposes a substrate with an exposure light beam through a liquid, the method comprising:
  judging a state of a liquid immersion member based on a state of a liquid immersion area formed on a side of a light-exit surface of an optical member; and
  detaching the liquid immersion member, based on a result of the judgment, from the exposure apparatus having the optical member via which the exposure light exits, the liquid immersion member being different from the optical member, the exposure apparatus exposing the substrate through a liquid, which is retained between the optical member and the substrate by the liquid immersion member, while moving the substrate relative to the optical member and the liquid immersion member; and
  cleaning the detached liquid immersion member or exchanging the detaching liquid immersion member with another liquid immersion member.

33. The maintenance method according to claim 32, wherein the liquid immersion member has at least one of a supply port supplying the liquid and a recovery port recovering the liquid.

34. The maintenance method according to claim 33, wherein a porous member is arranged in the recovery port.

35. The maintenance method according to claim 32, further comprising attaching the liquid immersion member which has been cleaned to the exposure apparatus, or attaching the another liquid immersion member, with which the detached liquid immersion member has been exchanged, to the exposure apparatus; and
  cleaning the attached liquid immersion member.

36. The maintenance method according to claim 35, wherein the attached liquid immersion member is cleaned by bringing the attached liquid immersion member into contact with the liquid.

37. The maintenance method according to claim 36, wherein the attached liquid immersion member is cleaned by supplying the liquid between the attached liquid immersion member and a dummy substrate which is different from the substrate.

38. An exposure method comprising:
  performing maintenance of an exposure apparatus having a liquid immersion member with the maintenance method as defined in claim 32; and
  exposing a substrate through a liquid.

39. A method for producing a device, comprising:
  exposing a substrate by the exposure method as defined in claim 38;
  developing the exposed substrate; and
  processing the developed substrate.

* * * * *